(12) United States Patent
Hui et al.

(10) Patent No.: US 10,944,511 B2
(45) Date of Patent: Mar. 9, 2021

(54) INFORMATION BITS FOR POLAR CODES WITH MIXED CRITERIA

(71) Applicant: TELEFONAKTIEBOLAGET LM ERICSSON (PUBL), Stockholm (SE)

(72) Inventors: Dennis Hui, Sunnyvale, CA (US); Yufei Blankenship, Kildeer, IL (US); Anders Wesslén, Staffanstorp (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/272,219

(22) Filed: Feb. 11, 2019

(65) Prior Publication Data
US 2019/0229850 A1   Jul. 25, 2019

Related U.S. Application Data

(63) Continuation of application No. PCT/IB2018/059180, filed on Nov. 21, 2018.
(Continued)

(51) Int. Cl.
*H04L 1/00* (2006.01)
*H03M 13/13* (2006.01)
(Continued)

(52) U.S. Cl.
CPC .......... *H04L 1/0072* (2013.01); *H03M 13/13* (2013.01); *H04L 1/0061* (2013.01);
(Continued)

(58) Field of Classification Search
CPC ... H04L 1/0072; H04L 1/0061; H04L 1/0071; H04L 1/1614; H04W 56/001; H03M 13/13
See application file for complete search history.

(56) References Cited

U.S. PATENT DOCUMENTS

2009/0060012 A1\* 3/2009 Gresset ................. H04B 7/022
 375/219
2010/0272009 A1\* 10/2010 Cheng ................. H04W 52/346
 370/315
(Continued)

FOREIGN PATENT DOCUMENTS

WO  2018127183 A1  7/2018

OTHER PUBLICATIONS

Mediatek Inc., "Design of Order and Mapping of PBCH Fields," 3GPP TSG RAN WG1 Rani Meeting #91, R1-1719576; Reno, USA, Nov. 27-Dec. 1, 2017, 10 pages.
(Continued)

*Primary Examiner* — Jianye Wu

(57) ABSTRACT

According to some embodiments, a method performed by a wireless device for polar encoding payload bits comprises: identifying payload bits of a data channel that have known values; placing a first subset of the known payload bits at input positions of a polar encoder that correspond to the earliest decoding bit positions of the polar encoder; placing a second subset of the known payload bits at input positions of the polar encoder that correspond to the least reliable decoding bit positions of the polar encoder after placement of the first subset of the known payload bits; and transmitting the polar encoded payload bits to a wireless receiver. The first subset of the known payload bits are placed in earliest decoding bit positions to improve early termination gain. The second subset of the known payload bits are placed in least reliable decoding bit positions to enhance error performance.

20 Claims, 24 Drawing Sheets

2500

2512 - identify payload bits of a data channel that have known values

2514 - place a first subset of the known payload bits at input positions of a polar encoder that correspond to the earliest decoding bit positions of the polar encoder 2516 - place a second subset of the known payload bits at input positions of the polar encoder that correspond to the least reliable decoding bit positions of the polar encoder after placement of the first subset of the known payload bits 2518 - polar encode the payload bits 2520 - transmit the polar encoded payload bits to a wireless receiver

Related U.S. Application Data

(60) Provisional application No. 62/590,520, filed on Nov. 24, 2017.

(51) Int. Cl.
*H04L 1/16* (2006.01)
*H04W 56/00* (2009.01)

(52) U.S. Cl.
CPC .......... *H04L 1/0071* (2013.01); *H04L 1/1614* (2013.01); *H04W 56/001* (2013.01)

(56) References Cited

U.S. PATENT DOCUMENTS

| | | | | |
|---|---|---|---|---|
| 2014/0198726 A1* | 7/2014 | Xu | ........................ | H04W 24/02 370/328 |
| 2015/0194987 A1* | 7/2015 | Li | ........................ | H04L 1/0057 714/752 |
| 2016/0142898 A1* | 5/2016 | Poitau | ................... | H04W 76/14 370/329 |
| 2017/0344283 A1* | 11/2017 | Guim Bernat | ........ | G06F 3/0619 |
| 2018/0076923 A1* | 3/2018 | Wu | ........................ | H03M 13/09 |
| 2019/0140663 A1* | 5/2019 | Noh | ........................ | H04L 1/18 |
| 2019/0158226 A1* | 5/2019 | Hui | ................... | H03M 13/2906 |

OTHER PUBLICATIONS

Tal et al., "List Decoding of Polar Codes," pp. 1-11.

Leroux et al.,"A semi-parallel successive-cancellation decoder for polar codes." IEEE Transactions on Signal Processing, Jan. 15, 2013, 10 pages, vol. 61, No. 2.

Arikan, "Channel Polarization: A Method for Constructing Capacity-Achieving Codes for Symmetric Binary-Input Memoryless Channels," IEEE Transactions on Information Theory, Jul. 2009, pp. 3051-3073, vol. 55, No. 7.

\* cited by examiner

| SFN ($2^{nd}$, $3^{rd}$ LSBs) 2 bits | SFN ($1^{st}$, $4^{th}$, $5^{th}$, ..., $9^{th}$, $10^{th}$ LSBs) 8 bits | Half Frame Indication 1 bit | Other PBCH Fields 42 bits |

Ordering in increasing reliability →

Fig. 8

| Half Frame Indication 1 bit | SFN ($2^{nd}$, $3^{rd}$ LSBs) 2 bits | SFN ($1^{st}$, $4^{th}$, $5^{th}$, ..., $9^{th}$, $10^{th}$ LSBs) 8 bits | Other PBCH Fields 42 bits |

Ordering in increasing reliability →

Half Frame Indication 1 bit | SFN (1st, 4th, 5th, ..., 9th, 10th LSBs) 8 bits | SFN (2nd, 3rd LSBs) 2 bits | Other PBCH Fields 42 bits Ordering in increasing reliability →

Fig. 11

SFN (1st, 4th, 5th, ..., 9th, 10th LSBs) 8 bits | SFN (2nd, 3rd LSBs) 2 bits | Half Frame Indication 1 bit | Other PBCH Fields 42 bits Ordering in increasing reliability →

Fig. 12

SFN (1st, 4th, 5th,...,9th,10th (LSBs)) 8 bits | Half Frame Indication 1 bit | SFN (2nd, 3rd LSBs) 2 bits | Other PBCH Fields 42 bits Ordering in increasing reliability →

Fig. 13

Half Frame Indication 1 bit | SFN (1st, 2nd, 3rd, 4th, 5th,...,9th,10th (LSBs)) 10 bits | Other PBCH Fields 42 bits

| SFN ($2^{nd}$, $3^{rd}$ LSBs) 2 bits | SFN ($1^{st}$, $4^{th}$, $5^{th}$, ..., $9^{th}$, $10^{th}$ LSBs) 8 bits | Other PBCH Fields 42 bits |

Ordering in increasing reliability →

Fig. 20

| SFN ($1^{st}$, $4^{th}$, $5^{th}$, ..., $9^{th}$, $10^{th}$ LSBs) 8 bits | SFN ($2^{nd}$, $3^{rd}$ LSBs) 2 bits | Other PBCH Fields 42 bits |

Ordering in increasing reliability →

Fig. 21

INFORMATION BITS FOR POLAR CODES WITH MIXED CRITERIA

This application is a continuation of International Application No. PCT/IB2018/059180, filed Nov. 21, 2018, which claims the benefit of U.S. Provisional Application No. 62/590,520, filed Nov. 24, 2017, the disclosure of which is fully incorporated herein by reference.

TECHNICAL FIELD

Particular embodiments are directed to wireless communications and, more particularly, to polar coding and selection of information bit placement based on mixed criteria.

INTRODUCTION

Generally, all terms used herein are to be interpreted according to their ordinary meaning in the relevant technical field, unless a different meaning is clearly given and/or is implied from the context in which it is used. All references to a/an/the element, apparatus, component, means, step, etc. are to be interpreted openly as referring to at least one instance of the element, apparatus, component, means, step, etc., unless explicitly stated otherwise.

The steps of any methods disclosed herein do not have to be performed in the exact order disclosed, unless a step is explicitly described as following or preceding another step and/or where it is implicit that a step must follow or precede another step. Any feature of any of the embodiments disclosed herein may be applied to any other embodiment, wherever appropriate. Likewise, any advantage of any of the embodiments may apply to any other embodiments, and vice versa. Other objectives, features and advantages of the enclosed embodiments will be apparent from the following description.

Polar codes, proposed by E. Arikan, "Channel Polarization: A Method for Constructing Capacity-Achieving Codes for Symmetric Binary-Input Memoryless Channels," IEEE Transactions on Information Theory, vol. 55, pp. 3051-3073, July 2009, are a class of constructive coding schemes that achieve the symmetric capacity of the binary-input discrete memoryless channels under a low-complexity successive cancellation (SC) decoder. The finite-length performance of polar codes under SC, however, is not competitive compared to other modern channel coding schemes such as low-density parity-check (LDPC) codes and Turbo codes. An SC list (SCL) decoder is proposed in I. Tal and A. Vardy, "List Decoding of polar codes," Proceedings of IEEE Symp. Inf. Theory, pp. 1-5, 2011, that approaches the performance of optimal maximum-likelihood (ML) decoder. By concatenating a simple cyclic redundancy check (CRC) coding, the performance of a concatenated polar code is competitive with that of well-optimized LDPC and Turbo codes. As a result, polar codes are being considered as a candidate for future fifth generation (5G) wireless communication systems.

Polar coding transforms a pair of identical binary-input channels into two distinct channels of different qualities, one better and one worse than the original binary-input channel. Repeating such a pair-wise polarizing operation on a set of $N=2^n$ independent uses of a binary-input channel results in a set of $2^n$ "bit-channels" of varying qualities. Some of the bit channels are nearly perfect (i.e., error free) while the rest of them are nearly useless (i.e., totally noisy).

Polar coding uses the nearly perfect channel to transmit data to the receiver and sets the input to the useless channels to have fixed or frozen values (e.g., 0) known to the receiver. For this reason, the input bits to the nearly useless and the nearly perfect channel are commonly referred to as frozen bits and non-frozen (or information) bits, respectively. Only the non-frozen bits are used to carry data in a polar code. Loading the data into the proper information bit locations has direct impact on the performance of a polar code. The set of information bit locations is commonly referred to as an information set. An illustration of the structure of a length-8 polar code is illustrated in FIG. 1.

FIG. 2 illustrates the labeling of the intermediate information bits $s_{l,i}$, where $l \in \{0, 1, \ldots, n\}$ and $i \in \{0, 1, \ldots, N-1\}$ during polar encoding with $N=8$. The intermediate information bits are related by the following equation:

$$s_{l+1,i} = s_{l,i} \oplus s_{l,i+2^l}, \text{ for}$$

$$i \in \left\{ j \in \{0, 1, \ldots, N-1\} : \text{mod}\left(\left\lfloor \frac{j}{2^i} \right\rfloor, 2\right) = 0 \right\} \text{ and}$$

$$l \in \{0, 1, \ldots, n-1\}, \text{ and}$$

$$s_{l+1,i+2^l} = s_{l,i+2^l}, \text{ for}$$

$$i \in \left\{ j \in \{0, 1, \ldots, N-1\} : \text{mod}\left(\left\lfloor \frac{j}{2^i} \right\rfloor, 2\right) = 0 \right\} \text{ and}$$

$$l \in \{0, 1, \ldots, n-1\}$$

where $s_{0,i} = u_i$ are the information bits and $s_{n,i} \equiv x_i$ are the code bits for $i \in \{0, 1, \ldots, N-1\}$.

The reliability of bit channels can be sorted into a polar information sequence, which specifies the index of the bit channels of any given reliability rank.

In the Third Generation Partnership Project (3GPP) fifth generation (5G) new radio (NR) standard, the polar information sequence, or just polar sequence, $Q_0^{N_{max}-1} = \{Q_0^{N_{max}}, Q_1^{N_{max}}, \ldots, Q_{N_{max}-1}^{N_{max}}\}$ is given by Table 1 below, where $0 \leq Q_i^{N_{max}} \leq N_{max}-1$ denotes a bit index before polar encoding for $i=0, 1, \ldots, N-1$ and $N_{max}=1024$. The polar sequence $Q_0^{N_{max}-1}$ is in ascending order of reliability $W(Q_0^{N_{max}}) < W(Q_1^{N_{max}}) < \ldots < W(Q_{N_{max}-1}^{N_{max}})$, where $W(Q_i^{N_{max}})$ denotes the reliability of bit index $Q_i^{N_{max}}$.

For any code block encoded to N bits, the same polar sequence $Q_0^{N-1} = \{Q_0^N, Q_1^N, Q_2^N, \ldots, Q_{N-1}^N\}$ is used. The polar sequence $Q_0^{N-1}$ is a subset of polar sequence $Q_0^{N_{max}-1}$ with all elements $Q_i^{N_{max}}$ of values less than N, ordered in ascending order of reliability $W(Q_0^N) < W(Q_1^N) < W(Q_2^N) < \ldots < W(Q_{N-1}^N)$.

TABLE 1

Polar sequence $Q_0^{N_{max}-1}$ and its corresponding reliability $W(Q_i^{N_{max}})$

| W($Q_i^{Nmax}$) | $Q_i^{Nmax}$ | W($Q_i^{Nmax}$) | $Q_i^{Nmax}$ | W($Q_i^{Nmax}$) | $Q_i^{Nmax}$ | W($Q_i^{Nmax}$) | $Q_i^{Nmax}$ | W($Q_i^{Nmax}$) | $Q_i^{Nmax}$ | W($Q_i^{Nmax}$) | $Q_i^{Nmax}$ | W($Q_i^{Nmax}$) | $Q_i^{Nmax}$ | W($Q_i^{Nmax}$) | $Q_i^{Nmax}$ |
|---|---|---|---|---|---|---|---|---|---|---|---|---|---|---|---|
| 0 | 0 | 128 | 518 | 256 | 94 | 384 | 214 | 512 | 364 | 640 | 414 | 768 | 819 | 896 | 966 |
| 1 | 1 | 129 | 54 | 257 | 204 | 385 | 309 | 513 | 654 | 641 | 223 | 769 | 814 | 897 | 755 |
| 2 | 2 | 130 | 83 | 258 | 298 | 386 | 188 | 514 | 659 | 642 | 663 | 770 | 439 | 898 | 859 |

TABLE 1-continued

Polar sequence $Q_0^{Nmax-1}$ and its corresponding reliability $W(Q_i^{Nmax})$

| $W(Q_i^{Nmax})$ | $Q_i^{Nmax}$ | $W(Q_i^{Nmax})$ | $Q_i^{Nmax}$ | $W(Q_i^{Nmax})$ | $Q_i^{Nmax}$ | $W(Q_i^{Nmax})$ | $Q_i^{Nmax}$ | $W(Q_i^{Nmax})$ | $Q_i^{Nmax}$ | $W(Q_i^{Nmax})$ | $Q_i^{Nmax}$ | $W(Q_i^{Nmax})$ | $Q_i^{Nmax}$ | $W(Q_i^{Nmax})$ | $Q_i^{Nmax}$ |
|---|---|---|---|---|---|---|---|---|---|---|---|---|---|---|---|
| 3 | 4 | 131 | 57 | 259 | 400 | 387 | 449 | 515 | 335 | 643 | 692 | 771 | 929 | 899 | 940 |
| 4 | 8 | 132 | 521 | 260 | 608 | 388 | 217 | 516 | 480 | 644 | 835 | 772 | 490 | 900 | 830 |
| 5 | 16 | 133 | 112 | 261 | 352 | 389 | 408 | 517 | 315 | 645 | 619 | 773 | 623 | 901 | 911 |
| 6 | 32 | 134 | 135 | 262 | 325 | 390 | 609 | 518 | 221 | 646 | 472 | 774 | 671 | 902 | 871 |
| 7 | 3 | 135 | 78 | 263 | 533 | 391 | 596 | 519 | 370 | 647 | 455 | 775 | 739 | 903 | 639 |
| 8 | 5 | 136 | 289 | 264 | 155 | 392 | 551 | 520 | 613 | 648 | 796 | 776 | 916 | 904 | 888 |
| 9 | 64 | 137 | 194 | 265 | 210 | 393 | 650 | 521 | 422 | 649 | 809 | 777 | 463 | 905 | 479 |
| 10 | 9 | 138 | 85 | 266 | 305 | 394 | 229 | 522 | 425 | 650 | 714 | 778 | 843 | 906 | 946 |
| 11 | 6 | 139 | 276 | 267 | 547 | 395 | 159 | 523 | 451 | 651 | 721 | 779 | 381 | 907 | 750 |
| 12 | 17 | 140 | 522 | 268 | 300 | 396 | 420 | 524 | 614 | 652 | 837 | 780 | 497 | 908 | 969 |
| 13 | 10 | 141 | 58 | 269 | 109 | 397 | 310 | 525 | 543 | 653 | 716 | 781 | 930 | 909 | 508 |
| 14 | 18 | 142 | 168 | 270 | 184 | 398 | 541 | 526 | 235 | 654 | 864 | 782 | 821 | 910 | 861 |
| 15 | 128 | 143 | 139 | 271 | 534 | 399 | 773 | 527 | 412 | 655 | 810 | 783 | 726 | 911 | 757 |
| 16 | 12 | 144 | 99 | 272 | 537 | 400 | 610 | 528 | 343 | 656 | 606 | 784 | 961 | 912 | 970 |
| 17 | 33 | 145 | 86 | 273 | 115 | 401 | 657 | 529 | 372 | 657 | 912 | 785 | 872 | 913 | 919 |
| 18 | 65 | 146 | 60 | 274 | 167 | 402 | 333 | 530 | 775 | 658 | 722 | 786 | 492 | 914 | 875 |
| 19 | 20 | 147 | 280 | 275 | 225 | 403 | 119 | 531 | 317 | 659 | 696 | 787 | 631 | 915 | 862 |
| 20 | 256 | 148 | 89 | 276 | 326 | 404 | 600 | 532 | 222 | 660 | 377 | 788 | 729 | 916 | 758 |
| 21 | 34 | 149 | 290 | 277 | 306 | 405 | 339 | 533 | 426 | 661 | 435 | 789 | 700 | 917 | 948 |
| 22 | 24 | 150 | 529 | 278 | 772 | 406 | 218 | 534 | 453 | 662 | 817 | 790 | 443 | 918 | 977 |
| 23 | 36 | 151 | 524 | 279 | 157 | 407 | 368 | 535 | 237 | 663 | 319 | 791 | 741 | 919 | 923 |
| 24 | 7 | 152 | 196 | 280 | 656 | 408 | 652 | 536 | 559 | 664 | 621 | 792 | 845 | 920 | 972 |
| 25 | 129 | 153 | 141 | 281 | 329 | 409 | 230 | 537 | 833 | 665 | 812 | 793 | 920 | 921 | 761 |
| 26 | 66 | 154 | 101 | 282 | 110 | 410 | 391 | 538 | 804 | 666 | 484 | 794 | 382 | 922 | 877 |
| 27 | 512 | 155 | 147 | 283 | 117 | 411 | 313 | 539 | 712 | 667 | 430 | 795 | 822 | 923 | 952 |
| 28 | 11 | 156 | 176 | 284 | 212 | 412 | 450 | 540 | 834 | 668 | 838 | 796 | 851 | 924 | 495 |
| 29 | 40 | 157 | 142 | 285 | 171 | 413 | 542 | 541 | 661 | 669 | 667 | 797 | 730 | 925 | 703 |
| 30 | 68 | 158 | 530 | 286 | 776 | 414 | 334 | 542 | 808 | 670 | 488 | 798 | 498 | 926 | 935 |
| 31 | 130 | 159 | 321 | 287 | 330 | 415 | 233 | 543 | 779 | 671 | 239 | 799 | 880 | 927 | 978 |
| 32 | 19 | 160 | 31 | 288 | 226 | 416 | 555 | 544 | 617 | 672 | 378 | 800 | 742 | 928 | 883 |
| 33 | 13 | 161 | 200 | 289 | 549 | 417 | 774 | 545 | 604 | 673 | 459 | 801 | 445 | 929 | 762 |
| 34 | 48 | 162 | 90 | 290 | 538 | 418 | 175 | 546 | 433 | 674 | 622 | 802 | 471 | 930 | 503 |
| 35 | 14 | 163 | 545 | 291 | 387 | 419 | 123 | 547 | 720 | 675 | 627 | 803 | 635 | 931 | 925 |
| 36 | 72 | 164 | 292 | 292 | 308 | 420 | 658 | 548 | 816 | 676 | 437 | 804 | 932 | 932 | 878 |
| 37 | 257 | 165 | 322 | 293 | 216 | 421 | 612 | 549 | 836 | 677 | 380 | 805 | 687 | 933 | 735 |
| 38 | 21 | 166 | 532 | 294 | 416 | 422 | 341 | 550 | 347 | 678 | 818 | 806 | 903 | 934 | 993 |
| 39 | 132 | 167 | 263 | 295 | 271 | 423 | 777 | 551 | 897 | 679 | 461 | 807 | 825 | 935 | 885 |
| 40 | 35 | 168 | 149 | 296 | 279 | 424 | 220 | 552 | 243 | 680 | 496 | 808 | 500 | 936 | 939 |
| 41 | 258 | 169 | 102 | 297 | 158 | 425 | 314 | 553 | 662 | 681 | 669 | 809 | 846 | 937 | 994 |
| 53 | 96 | 181 | 386 | 309 | 199 | 437 | 616 | 565 | 840 | 693 | 441 | 821 | 487 | 949 | 751 |
| 54 | 67 | 182 | 150 | 310 | 784 | 438 | 342 | 566 | 625 | 694 | 469 | 822 | 695 | 950 | 942 |
| 55 | 41 | 183 | 153 | 311 | 179 | 439 | 316 | 567 | 238 | 695 | 247 | 823 | 746 | 951 | 996 |
| 56 | 144 | 184 | 165 | 312 | 228 | 440 | 241 | 568 | 359 | 696 | 683 | 824 | 828 | 952 | 971 |
| 57 | 28 | 185 | 106 | 313 | 338 | 441 | 778 | 569 | 457 | 697 | 842 | 825 | 753 | 953 | 890 |
| 58 | 69 | 186 | 55 | 314 | 312 | 442 | 563 | 570 | 399 | 698 | 738 | 826 | 854 | 954 | 509 |
| 59 | 42 | 187 | 328 | 315 | 704 | 443 | 345 | 571 | 787 | 699 | 899 | 827 | 857 | 955 | 949 |
| 60 | 516 | 188 | 536 | 316 | 390 | 444 | 452 | 572 | 591 | 700 | 670 | 828 | 504 | 956 | 973 |
| 61 | 49 | 189 | 577 | 317 | 174 | 445 | 397 | 573 | 678 | 701 | 783 | 829 | 799 | 957 | 1000 |
| 62 | 74 | 190 | 548 | 318 | 554 | 446 | 403 | 574 | 434 | 702 | 849 | 830 | 255 | 958 | 892 |
| 63 | 272 | 191 | 113 | 319 | 581 | 447 | 207 | 575 | 677 | 703 | 820 | 831 | 964 | 959 | 950 |
| 64 | 160 | 192 | 154 | 320 | 393 | 448 | 674 | 576 | 349 | 704 | 728 | 832 | 909 | 960 | 863 |
| 65 | 520 | 193 | 79 | 321 | 283 | 449 | 558 | 577 | 245 | 705 | 928 | 833 | 719 | 961 | 759 |
| 66 | 288 | 194 | 269 | 322 | 122 | 450 | 785 | 578 | 458 | 706 | 791 | 834 | 477 | 962 | 1008 |
| 67 | 528 | 195 | 108 | 323 | 448 | 451 | 432 | 579 | 666 | 707 | 367 | 835 | 915 | 963 | 510 |
| 68 | 192 | 196 | 578 | 324 | 353 | 452 | 357 | 580 | 620 | 708 | 901 | 836 | 638 | 964 | 979 |
| 69 | 544 | 197 | 224 | 325 | 561 | 453 | 187 | 581 | 363 | 709 | 630 | 837 | 748 | 965 | 953 |
| 70 | 70 | 198 | 166 | 326 | 203 | 454 | 236 | 582 | 127 | 710 | 685 | 838 | 944 | 966 | 763 |
| 71 | 44 | 199 | 519 | 327 | 63 | 455 | 664 | 583 | 191 | 711 | 844 | 839 | 869 | 967 | 974 |
| 72 | 131 | 200 | 552 | 328 | 340 | 456 | 624 | 584 | 782 | 712 | 633 | 840 | 491 | 968 | 954 |
| 73 | 81 | 201 | 195 | 329 | 394 | 457 | 587 | 585 | 407 | 713 | 711 | 841 | 699 | 969 | 879 |
| 74 | 50 | 202 | 270 | 330 | 527 | 458 | 780 | 586 | 436 | 714 | 253 | 842 | 754 | 970 | 981 |
| 75 | 73 | 203 | 641 | 331 | 582 | 459 | 705 | 587 | 626 | 715 | 691 | 843 | 858 | 971 | 982 |
| 76 | 15 | 204 | 523 | 332 | 556 | 460 | 126 | 588 | 571 | 716 | 824 | 844 | 478 | 972 | 927 |
| 77 | 320 | 205 | 275 | 333 | 181 | 461 | 242 | 589 | 465 | 717 | 902 | 845 | 968 | 973 | 995 |
| 78 | 133 | 206 | 580 | 334 | 295 | 462 | 565 | 590 | 681 | 718 | 686 | 846 | 383 | 974 | 765 |
| 79 | 52 | 207 | 291 | 335 | 285 | 463 | 398 | 591 | 246 | 719 | 740 | 847 | 910 | 975 | 956 |
| 80 | 23 | 208 | 59 | 336 | 232 | 464 | 346 | 592 | 707 | 720 | 850 | 848 | 815 | 976 | 887 |
| 81 | 134 | 209 | 169 | 337 | 124 | 465 | 456 | 593 | 350 | 721 | 375 | 849 | 976 | 977 | 985 |
| 82 | 384 | 210 | 560 | 338 | 205 | 466 | 358 | 594 | 599 | 722 | 444 | 850 | 870 | 978 | 997 |
| 83 | 76 | 211 | 114 | 339 | 182 | 467 | 405 | 595 | 668 | 723 | 470 | 851 | 917 | 979 | 986 |
| 84 | 137 | 212 | 277 | 340 | 643 | 468 | 303 | 596 | 790 | 724 | 483 | 852 | 727 | 980 | 943 |
| 96 | 43 | 224 | 526 | 352 | 645 | 480 | 647 | 608 | 689 | 736 | 797 | 864 | 918 | 992 | 1009 |
| 97 | 98 | 225 | 177 | 353 | 593 | 481 | 348 | 609 | 374 | 737 | 906 | 865 | 502 | 993 | 955 |
| 98 | 515 | 226 | 293 | 354 | 535 | 482 | 419 | 610 | 423 | 738 | 715 | 866 | 933 | 994 | 1004 |
| 99 | 88 | 227 | 388 | 355 | 240 | 483 | 406 | 611 | 466 | 739 | 807 | 867 | 743 | 995 | 1010 |

TABLE 1-continued

Polar sequence $Q_0^{Nmax-1}$ and its corresponding reliability $W(Q_i^{Nmax})$

| W($Q_i^{Nmax}$) | $Q_i^{Nmax}$ | W($Q_i^{Nmax}$) | $Q_i^{Nmax}$ | W($Q_i^{Nmax}$) | $Q_i^{Nmax}$ | W($Q_i^{Nmax}$) | $Q_i^{Nmax}$ | W($Q_i^{Nmax}$) | $Q_i^{Nmax}$ | W($Q_i^{Nmax}$) | $Q_i^{Nmax}$ | W($Q_i^{Nmax}$) | $Q_i^{Nmax}$ | W($Q_i^{Nmax}$) | $Q_i^{Nmax}$ |
|---|---|---|---|---|---|---|---|---|---|---|---|---|---|---|---|
| 100 | 140 | 228 | 91 | 356 | 206 | 484 | 464 | 612 | 793 | 740 | 474 | 868 | 760 | 996 | 957 |
| 101 | 30 | 229 | 584 | 357 | 95 | 485 | 680 | 613 | 250 | 741 | 636 | 869 | 881 | 997 | 983 |
| 102 | 146 | 230 | 769 | 358 | 327 | 486 | 801 | 614 | 371 | 742 | 694 | 870 | 494 | 998 | 958 |
| 103 | 71 | 231 | 198 | 359 | 564 | 487 | 362 | 615 | 481 | 743 | 254 | 871 | 702 | 999 | 987 |
| 104 | 262 | 232 | 172 | 360 | 800 | 488 | 590 | 616 | 574 | 744 | 717 | 872 | 921 | 1000 | 1012 |
| 105 | 265 | 233 | 120 | 361 | 402 | 489 | 409 | 617 | 413 | 745 | 575 | 873 | 501 | 1001 | 999 |
| 106 | 161 | 234 | 201 | 362 | 356 | 490 | 570 | 618 | 603 | 746 | 913 | 874 | 876 | 1002 | 1016 |
| 107 | 576 | 235 | 336 | 363 | 307 | 491 | 788 | 619 | 366 | 747 | 798 | 875 | 847 | 1003 | 767 |
| 108 | 45 | 236 | 62 | 364 | 301 | 492 | 597 | 620 | 468 | 748 | 811 | 876 | 992 | 1004 | 989 |
| 109 | 100 | 237 | 282 | 365 | 417 | 493 | 572 | 621 | 655 | 749 | 379 | 877 | 447 | 1005 | 1003 |
| 110 | 640 | 238 | 143 | 366 | 213 | 494 | 219 | 622 | 900 | 750 | 697 | 878 | 733 | 1006 | 990 |
| 111 | 51 | 239 | 103 | 367 | 568 | 495 | 311 | 623 | 805 | 751 | 431 | 879 | 827 | 1007 | 1005 |
| 112 | 148 | 240 | 178 | 368 | 832 | 496 | 708 | 624 | 615 | 752 | 607 | 880 | 934 | 1008 | 959 |
| 113 | 46 | 241 | 294 | 369 | 588 | 497 | 598 | 625 | 684 | 753 | 489 | 881 | 882 | 1009 | 1011 |
| 114 | 75 | 242 | 93 | 370 | 186 | 498 | 601 | 626 | 710 | 754 | 866 | 882 | 937 | 1010 | 1013 |
| 115 | 266 | 243 | 644 | 371 | 646 | 499 | 651 | 627 | 429 | 755 | 723 | 883 | 963 | 1011 | 895 |
| 116 | 273 | 244 | 202 | 372 | 404 | 500 | 421 | 628 | 794 | 756 | 486 | 884 | 747 | 1012 | 1006 |
| 117 | 517 | 245 | 592 | 373 | 227 | 501 | 792 | 629 | 252 | 757 | 908 | 885 | 505 | 1013 | 1014 |
| 118 | 104 | 246 | 323 | 374 | 896 | 502 | 802 | 630 | 373 | 758 | 718 | 886 | 855 | 1014 | 1017 |
| 119 | 162 | 247 | 392 | 375 | 594 | 503 | 611 | 631 | 605 | 759 | 813 | 887 | 924 | 1015 | 1018 |
| 120 | 53 | 248 | 297 | 376 | 418 | 504 | 602 | 632 | 848 | 760 | 476 | 888 | 734 | 1016 | 991 |
| 121 | 193 | 249 | 770 | 377 | 302 | 505 | 410 | 633 | 690 | 761 | 856 | 889 | 829 | 1017 | 1020 |
| 122 | 152 | 250 | 107 | 378 | 649 | 506 | 231 | 634 | 713 | 762 | 839 | 890 | 965 | 1018 | 1007 |
| 123 | 77 | 251 | 180 | 379 | 771 | 507 | 688 | 635 | 632 | 763 | 725 | 891 | 938 | 1019 | 1015 |
| 124 | 164 | 252 | 151 | 380 | 360 | 508 | 653 | 636 | 482 | 764 | 698 | 892 | 884 | 1020 | 1019 |
| 125 | 768 | 253 | 209 | 381 | 539 | 509 | 248 | 637 | 806 | 765 | 914 | 893 | 506 | 1021 | 1021 |
| 126 | 268 | 254 | 284 | 382 | 111 | 510 | 369 | 638 | 427 | 766 | 752 | 894 | 749 | 1022 | 1022 |
| 127 | 274 | 255 | 648 | 383 | 331 | 511 | 190 | 639 | 904 | 767 | 868 | 895 | 945 | 1023 | 1023 |

CRC interleaving may be used with polar coding. To improve the performance of early decoding termination or block error rate, the input to the polar encoder may be first interleaved after adding CRC bits computed based on a CRC polynomial. The interleaving distributes a subset of CRC bits among the CRC-interleaved payload bits.

FIG. 3 is a block diagram illustrating the general operation of CRC-interleaved polar encoding, which is also referred to as a distributed CRC method. The data bits u are first encoded using CRC encoder 10 whose output, referred to as payload bits, are interleaved using CRC interleaver 12 to form the input of polar encoder core 14, which in turn generates the coded bits. The set of data bits may contain bits with known or partially known values (shown as dashed lines in FIG. 3), such as the timing bits or the reserved bits, which are placed in positions that cannot be effectively used by the polar decoder.

In the 5G NR standard, the bit sequence $c_0, c_1, c_2, c_3, \ldots, c_{K-1}$ is interleaved into bit sequence $c_0', c_1', c_2', c_3', \ldots, c_{K-1}'$ as follows:

$$c_k' = c_{\Pi(k)}, k=0,1,\ldots,K-1$$

where the interleaving pattern n(k) is given by the following:

```
if I_IL = 0
    Π(k) = k , k = 0,1,...,K −1
else
    k = 0 ;
    for m = 0 to K_IL^max −1
        if Π_IL^max(m) ≥ K_IL^max − K
            Π(k) = Π_IL^max(m) − (K_IL^max − K);
            k = k + 1;
        end if
    end for
end if
``` where $\Pi_{IL}^{max}(m)$ is given by Table 2 below.

TABLE 2

Interleaving pattern $\Pi_{IL}^{max}(m)$

| m | $\Pi_{IL}^{max}(m)$ | m | $\Pi_{IL}^{max}(m)$ | m | $\Pi_{IL}^{max}(m)$ | m | $\Pi_{IL}^{max}(m)$ | m | $\Pi_{IL}^{max}(m)$ | m | $\Pi_{IL}^{max}(m)$ | m | $\Pi_{IL}^{max}(m)$ | m | $\Pi_{IL}^{max}(m)$ |
|---|---|---|---|---|---|---|---|---|---|---|---|---|---|---|---|
| 0 | 0 | 28 | 50 | 56 | 119 | 84 | 173 | 112 | 45 | 140 | 152 | 168 | 90 | 196 | 197 |
| 1 | 2 | 29 | 54 | 57 | 121 | 85 | 175 | 113 | 48 | 141 | 154 | 169 | 93 | 197 | 203 |
| 2 | 3 | 30 | 55 | 58 | 122 | 86 | 178 | 114 | 51 | 142 | 156 | 170 | 96 | 198 | 73 |
| 3 | 5 | 31 | 57 | 59 | 125 | 87 | 179 | 115 | 56 | 143 | 159 | 171 | 104 | 199 | 78 |
| 4 | 6 | 32 | 59 | 60 | 126 | 88 | 180 | 116 | 58 | 144 | 162 | 172 | 107 | 200 | 98 |
| 5 | 8 | 33 | 60 | 61 | 127 | 89 | 182 | 117 | 61 | 145 | 165 | 173 | 124 | 201 | 204 |
| 6 | 11 | 34 | 62 | 62 | 129 | 90 | 183 | 118 | 63 | 146 | 167 | 174 | 134 | 202 | 99 |
| 7 | 12 | 35 | 64 | 63 | 130 | 91 | 186 | 119 | 65 | 147 | 169 | 175 | 139 | 203 | 205 |
| 8 | 13 | 36 | 67 | 64 | 131 | 92 | 187 | 120 | 68 | 148 | 172 | 176 | 145 | 204 | 100 |
| 9 | 16 | 37 | 69 | 65 | 132 | 93 | 189 | 121 | 70 | 149 | 174 | 177 | 157 | 205 | 206 |
| 10 | 19 | 38 | 74 | 66 | 136 | 94 | 192 | 122 | 75 | 150 | 176 | 178 | 160 | 206 | 101 |
| 11 | 20 | 39 | 79 | 67 | 137 | 95 | 194 | 123 | 81 | 151 | 181 | 179 | 163 | 207 | 207 |
| 12 | 22 | 40 | 80 | 68 | 141 | 96 | 198 | 124 | 87 | 152 | 184 | 180 | 177 | 208 | 208 |

TABLE 2-continued

Interleaving pattern $\Pi_{IL}^{max}(m)$

| m | $\Pi_{IL}^{max}(m)$ | m | $\Pi_{IL}^{max}(m)$ | m | $\Pi_{IL}^{max}(m)$ | m | $\Pi_{IL}^{max}(m)$ | m | $\Pi_{IL}^{max}(m)$ | m | $\Pi_{IL}^{max}(m)$ | m | $\Pi_{IL}^{max}(m)$ | m | $\Pi_{IL}^{max}(m)$ |
|---|---|---|---|---|---|---|---|---|---|---|---|---|---|---|---|
| 13 | 24 | 41 | 84 | 69 | 142 | 97 | 199 | 125 | 89 | 153 | 188 | 181 | 185 | 209 | 209 |
| 14 | 28 | 42 | 85 | 70 | 143 | 98 | 200 | 126 | 92 | 154 | 190 | 182 | 191 | 210 | 210 |
| 15 | 32 | 43 | 86 | 71 | 147 | 99 | 1 | 127 | 95 | 155 | 193 | 183 | 196 | 211 | 211 |
| 16 | 33 | 44 | 88 | 72 | 148 | 100 | 4 | 128 | 103 | 156 | 195 | 184 | 202 | 212 | 212 |
| 17 | 35 | 45 | 91 | 73 | 149 | 101 | 7 | 129 | 106 | 157 | 201 | 185 | 27 | 213 | 213 |
| 18 | 37 | 46 | 94 | 74 | 151 | 102 | 9 | 130 | 112 | 158 | 10 | 186 | 31 | 214 | 214 |
| 19 | 38 | 47 | 102 | 75 | 153 | 103 | 14 | 131 | 115 | 159 | 15 | 187 | 53 | 215 | 215 |
| 20 | 39 | 48 | 105 | 76 | 155 | 104 | 17 | 132 | 117 | 160 | 18 | 188 | 72 | 216 | 216 |
| 21 | 40 | 49 | 109 | 77 | 158 | 105 | 21 | 133 | 120 | 161 | 26 | 189 | 77 | 217 | 217 |
| 22 | 41 | 50 | 110 | 78 | 161 | 106 | 23 | 134 | 123 | 162 | 30 | 190 | 83 | 218 | 218 |
| 23 | 42 | 51 | 111 | 79 | 164 | 107 | 25 | 135 | 128 | 163 | 52 | 191 | 97 | 219 | 219 |
| 24 | 44 | 52 | 113 | 80 | 166 | 108 | 29 | 136 | 133 | 164 | 66 | 192 | 108 | 220 | 220 |
| 25 | 46 | 53 | 114 | 81 | 168 | 109 | 34 | 137 | 138 | 165 | 71 | 193 | 135 | 221 | 221 |
| 26 | 47 | 54 | 116 | 82 | 170 | 110 | 36 | 138 | 144 | 166 | 76 | 194 | 140 | 222 | 222 |
| 27 | 49 | 55 | 118 | 83 | 171 | 111 | 43 | 139 | 150 | 167 | 82 | 195 | 146 | 223 | 223 |

5G NR communication systems can operate with carrier frequencies ranging from hundreds of MHz to hundreds of GHz. When operating in very high frequency band, such as the millimeter-wave (mmW) bands (~30-300 GHz), radio signals attenuate much more quickly with distance than those in lower frequency band (e.g., 1-3 GHz). Thus, to broadcast system information to user equipment (UE) over the same intended coverage area, beamforming is typically used to achieve power gain to compensate the path loss in high frequencies.

Because the signal coverage of each beam can be quite narrow when many antennas are used to form the beam, the system information needs to be broadcast or transmitted at a different beam direction one at a time. The process of transmitting signals carrying the same information using beams with different (azimuth and/or elevation) directions one at a time is commonly referred to as beam sweeping.

Because typically only one of the many beams carrying the same system information can reach a particular receiver with good signal strength, the receiver does not know the location of the received beam in the overall radio frame structure. To enable the receiver to determine the start and the end of a periodic radio frame, a time index is often included when broadcasting the system information through beam sweeping.

For example, FIG. 4 illustrates an example of how system information can be broadcast together with a reference synchronization signal (SS) through beam sweeping. In FIG. 4, the system information is carried by a physical channel, called new radio physical broadcast channel (NR-PBCH), which is transmitted in multiple synchronization blocks (SSB), each beamformed in a different direction. The SSBs are repeated within a certain NR-PBCH transmission time interval (TTI) (e.g., 80 ms in the illustrated example). Within a NR-PBCH TTI, the system information carried by NR-PBCH master information block (MIB) in each SSB is the same. Each NR-PBCH also carries a time index for the receiver to determine the radio frame boundaries. NR-PBCH may be encoded using polar codes.

A preferred construction of the content of PBCH is shown below.

| Information | Number of bits | Comment |
|---|---|---|
| SFN | 10 | |
| RMSI configuration | 8 | Includes all information needed to receive the PDCCH and PDSCH for RMSI including RMSI presence flag, RMSI/MSG2/4 SCS, possible QCL indication, and indication of initial active bandwidth part(if needed). 8 bits is the target with exact number of bits to be confirmed. |
| RMSI Numerology | 1 | |
| SS block time index | 3 | Only present for above 6 GHz |
| Half frame indication | 1 | |
| "CellBarred" flag | 2 | |
| 1st PDSCH DMRS position | 1 | Working assumption |
| PRB grid offset | 4 | Working assumption |
| Reserved bits | [4] (sub 6 GHz) [1] (above 6 GHz) | There will be at least 4 reserved bits. In addition, reserved bits are added to achieve byte alignment. Any additional agreed fields will reduce the number of reserved bits |
| Reserved RAN2 | 1 | |
| CRC | 24 | Aligned with PDCCH. |
| Total including CRC | 56 | Working assumption |

SUMMARY

Based on the description above, certain challenges currently exist. For example, A new radio physical broadcast channel (NR-PBCH), or any broadcast channel, often carries a subset of bits that are either known or partially known (e.g., a known relationship may exist between particular bits and other bits in adjacent blocks). Examples of the known or partially-known bits are timing bits (such as system frame number (SFN) and SS Block Time Index, which are known to have a fixed increment from one block to the next and may be known to the receiver in certain situations) and reserved bits (which are often set to known value such as 0 when they are not used). In existing solutions, the known or partially known bits are placed in arbitrary positions, which does not enable the decoder to effectively use the known bit values during the decoding process to optimize given performance criteria.

In addition, often two or more competing performance criteria affect the choice of the placement of known or partially known bits. For example, minimizing the block error rate may be accomplished by placing the known or partially known bits in the least reliable positions among the set of the most reliable positions for the given number of data bits. Alternatively, minimizing the decoding latency may be accomplished by maximizing the early decoding termination rate to reduce latency and energy consumption. This can be accomplished by placing the known or partially known bits in the bit positions that are decoded earliest. However, to accomplish both goals, it is not clear how to place the known and partially known bits to achieve a good compromise.

Certain aspects of the present disclosure and their embodiments may provide solutions to the challenges described above. Particular embodiments identify the payload bits of a new radio (NR) physical broadcast channel (PBCH) that have known values (typically all zero or some hypothesized values based on their relationship with adjacent blocks) and a subset of the known or partially known bits that is suited for achieving the first performance criteria, such as the early decoding termination gain. The subset of bits are placed accordingly to optimize the first performance criteria. Another subset of the rest of the known bits that is suitable for achieving the second performance criteria is identified. The subset of bits are then placed accordingly to optimize the second performance criteria. The process is repeated until all performance criteria have been addressed. If known bits still remain, they may be placed arbitrarily.

Particular embodiments include a known-bit interleaver for the known bits to compensate for the effect of bit-channel reliability ordering and cyclic redundancy check (CRC) interleaving so that the known or partially known (timing or reserved) bits can be placed in an advantageous position for the polar decoder to enhance performance according to one or multiple criteria. The interleaver can be determined by extracting the relevant known bits for each performance criteria one at a time until all performance criteria have been addressed.

Alternatively, the known-bit interleaver may be effectively substituted by a known-bit mapper that directly places the known bits into advantageous positions that satisfy the performance criteria at the input of the CRC interleaver or at the input of the polar encoder.

A number of specific known-bit mappers of known or partially known bits at the input of the CRC interleaver for the PBCH broadcast channel of the 5G-NR systems are presented that improve both the early termination performance and the block error performance. Particular embodiments place known bits to reach a compromise between competing performance criteria.

According to some embodiments, a method performed by a wireless device for polar encoding payload bits comprises: identifying payload bits of a data channel that have known values; placing a first subset of the known payload bits at input positions of a polar encoder that correspond to the earliest decoding bit positions of the polar encoder; placing a second subset of the known payload bits at input positions of the polar encoder that correspond to the least reliable decoding bit positions of the polar encoder after placement of the first subset of the known payload bits; polar encoding the payload bits; and transmitting the polar encoded payload bits to a wireless receiver.

In particular embodiments, the first subset of the known payload bits are placed in earliest decoding bit positions to improve early termination gain. The second subset of the known payload bits are placed in least reliable decoding bit positions to enhance error performance.

The payload bits that have known values may include one or more reserved bits. In particular embodiments, the identified payload bits that have known values include a half frame indication (HFI) bit, one or more SS block time index bits, and SFN bits. The first subset of the known payload bits may include HFI bit and one or more SS block time index bits, and the second subset of the known payload bits may include SFN bits. The one or more SS block time index bits may comprise the three most significant SS block time index bits. The SFN bits may comprise the second and third least significant SFN bits followed by the remaining SFN bits.

In particular embodiments, placing the first and second subset of known bits comprises placing the bits using a bit interleaver or a bit mapper. In particular embodiments, the wireless transmitter comprises a network node.

According to some embodiments, a wireless transmitter is configured to polar encode payload bits. The wireless transmitter comprises processing circuitry operable to: identify payload bits of a data channel that have known values; place a first subset of the known payload bits at input positions of a polar encoder that correspond to the earliest decoding bit positions of the polar encoder; place a second subset of the known payload bits at input positions of the polar encoder that correspond to the least reliable decoding bit positions of the polar encoder after placement of the first subset of the known payload bits; and transmit the polar encoded payload bits to a wireless receiver.

In particular embodiments, the first subset of the known payload bits are placed in earliest decoding bit positions to improve early termination gain. The second subset of the known payload bits are placed in least reliable decoding bit positions to enhance error performance.

In particular embodiments, the identified payload bits that have known values include a HFI bit, one or more SS block time index bits, and SFN bits. The first subset of the known payload bits may include HFI bit and one or more SS block time index bits, and the second subset of the known payload bits may include SFN bits. The one or more SS block time index bits may comprise the three most significant SS block time index bits. The SFN bits may comprise the second and third least significant SFN bits followed by the remaining SFN bits.

In particular embodiments, the processing circuitry operable to place the first and second subset of known bits comprises a bit interleaver or a bit mapper. The wireless transmitter may comprise a network node.

According to some embodiments, a method performed by a wireless receiver for polar decoding payload bits comprises receiving a wireless signal corresponding to a data channel that includes payload bits that have known values and decoding the wireless signal.

According to some embodiments, a wireless receiver is configured to polar decode payload bits. The wireless receiver comprises processing circuitry operable to receive a wireless signal corresponding to a data channel that includes payload bits that have known values and polar decode the wireless signal.

The known payload bits include a first subset of the known payload bits that are polar decoded earliest of the payload bits in the data channel and a second subset of the known payload bits that are polar decoded with least reliability of the payload bits in the data channel after polar decoding of the first subset of payload bits. In particular embodiments, the first subset of the known payload bits are in bit positions that are decoded earliest to improve early termination gain. The second subset of the known payload bits are in the least reliable bit positions of the polar encoder after placement of the first subset to enhance error performance.

In particular embodiments, the identified payload bits that have known values include a HFI bit, one or more SS block time index bits, and SFN bits. The first subset of the known payload bits may include HFI bit and one or more SS block time index bits, and the second subset of the known payload bits may include SFN bits. The one or more SS block time index bits may comprise the three most significant SS block time index bits. The SFN bits may comprise the second and third least significant SFN bits followed by the remaining SFN bits.

In particular embodiments, the wireless receiver comprises a network node.

According to some embodiments, a wireless transmitter is configured to polar encode payload bits. The wireless transmitter comprises an encoding unit and a transmitting unit. The encoding unit is operable to: identify payload bits of a data channel that have known values; place a first subset of the known payload bits at input positions of a polar encoder that correspond to the earliest decoding bit positions of the polar encoder; place a second subset of the known payload bits at input positions of the polar encoder that correspond to the least reliable decoding bit positions of the polar encoder after placement of the first subset of the known payload bits; and polar encode the payload bits. The transmitting unit is operable to transmit the polar encoded payload bits to a wireless receiver.

According to some embodiments, a wireless receiver is configured to polar decode payload bits. The wireless receiver comprises a receiving unit and a decoding unit. The receiving unit is operable to receive a wireless signal corresponding to a data channel that includes payload bits that have known values. The decoding unit is operable to polar decode the wireless signal. The known payload bits include a first subset of the known payload bits that are polar decoded earliest of the payload bits in the data channel and a second subset of the known payload bits that are polar decoded with least reliability of the payload bits in the data channel after polar decoding of the first subset of payload bits.

Also disclosed is a computer program product comprising a non-transitory computer readable medium storing computer readable program code, the computer readable program code operable, when executed by processing circuitry, to perform any of the methods performed by the wireless transmitter described above.

Another computer program product comprises a non-transitory computer readable medium storing computer readable program code, the computer readable program code operable, when executed by processing circuitry, to perform any of the methods performed by the wireless receiver described above.

There are, proposed herein, various embodiments which address one or more of the issues disclosed herein. Certain embodiments may provide one or more of the following technical advantages. A particular advantage is that multiple, mixed performance criteria can be fulfilled simultaneously. In particular, a specific placement of the known or partially known bits may provide early termination benefits of PBCH decoding and improve the error performance of the code (e.g., reducing the block error rate). The former alone can be achieved by placing bits with known values or partially known values in locations that will be decoded first. The latter alone can be achieved by judiciously placing bits with known values in locations with lower reliability. Bits with unknown values are assigned to locations with higher reliability in polar encoding. Thus, bits with unknown values are more likely to be decoded correctly. However, with existing solutions it is unclear how multiple criteria may be satisfied with the placement of known or partially known bits. Particular embodiments determine specific placements of the known or partially known bits to provide both early termination benefits and error performance enhancements.

BRIEF DESCRIPTION OF THE DRAWINGS

The accompanying drawing figures, incorporated in and forming a part of this specification, illustrate several aspects of the disclosure, and together with the description form a more complete understanding of the embodiments and their features and advantages.

FIGS. 7-14 illustrate various sets of known bits to be placed in the bit positions with lowest reliabilities, according to particular embodiments;

FIGS. 16-18 illustrate various sets of known bits to be placed in the bit positions with lowest reliabilities, according to particular embodiments;

FIGS. 20-22 illustrate various sets of known bits to be placed in the bit positions with lowest reliabilities, according to particular embodiments;

DETAILED DESCRIPTION

Particular embodiments are described more fully with reference to the accompanying drawings. Other embodiments, however, are contained within the scope of the subject matter disclosed herein. The disclosed subject matter should not be construed as limited to only the embodiments set forth herein; rather, these embodiments are provided by way of example to convey the scope of the subject matter to those skilled in the art.

Particular embodiments include an additional interleaver for the known bits to compensate for the effect of bit-channel reliability ordering and cyclic redundancy check (CRC) interleaving so that the known or partially known (e.g., reserved) bits can be placed in an advantageous position for the polar decoder to enhance performance according to one or multiple criteria. The interleaver can be determined by extracting relevant known bits for each performance criteria one at a time.

In some embodiments, the known-bit interleaver may be effectively substituted by a known-bit mapper that directly places the known bits into advantageous positions that satisfy the performance criteria at the input of the CRC interleaver or at the input of the polar encoder. An example is illustrated in FIG. 5.

Figure 1:
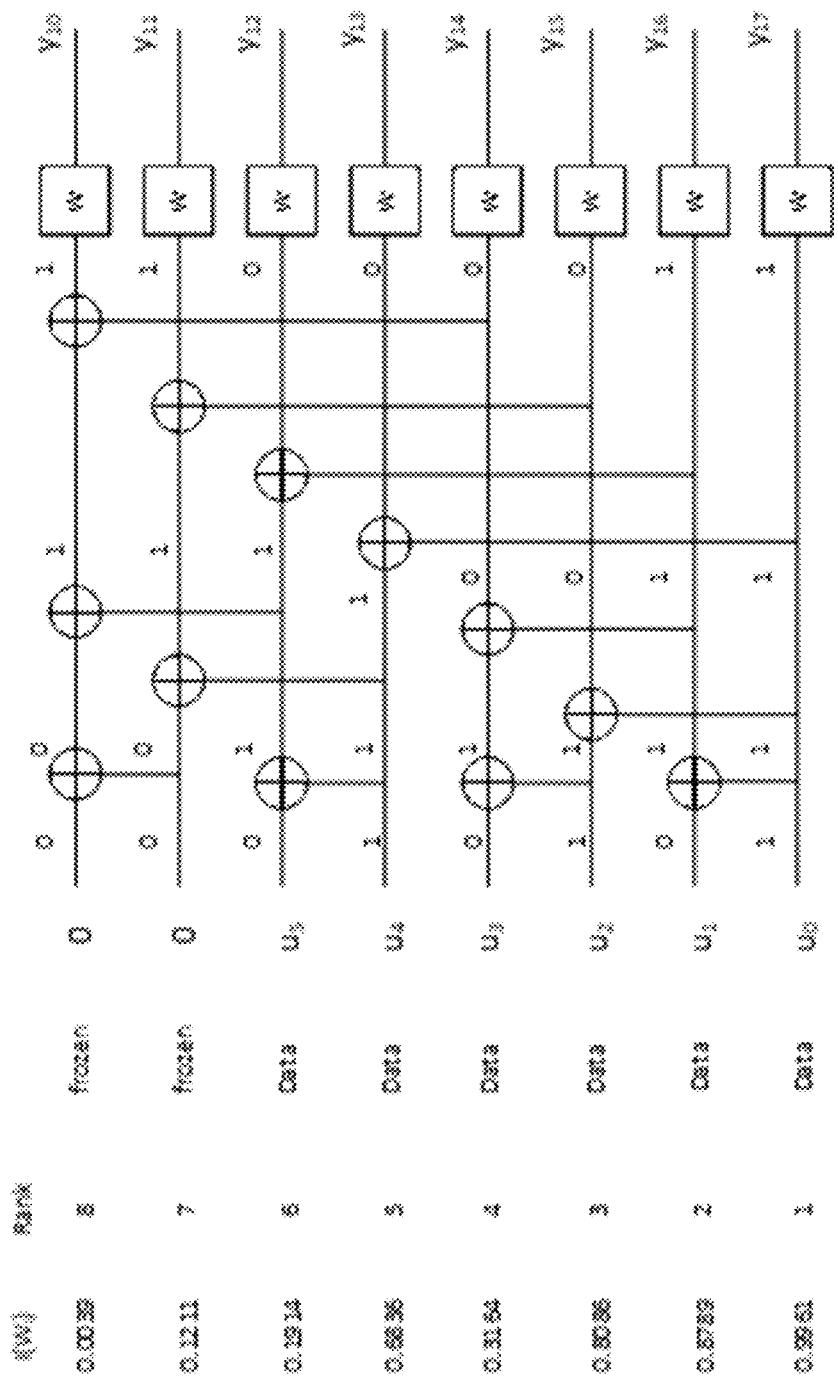
FIG. 1 illustrates an example of a polar code structure with N=8.
Figure 2:
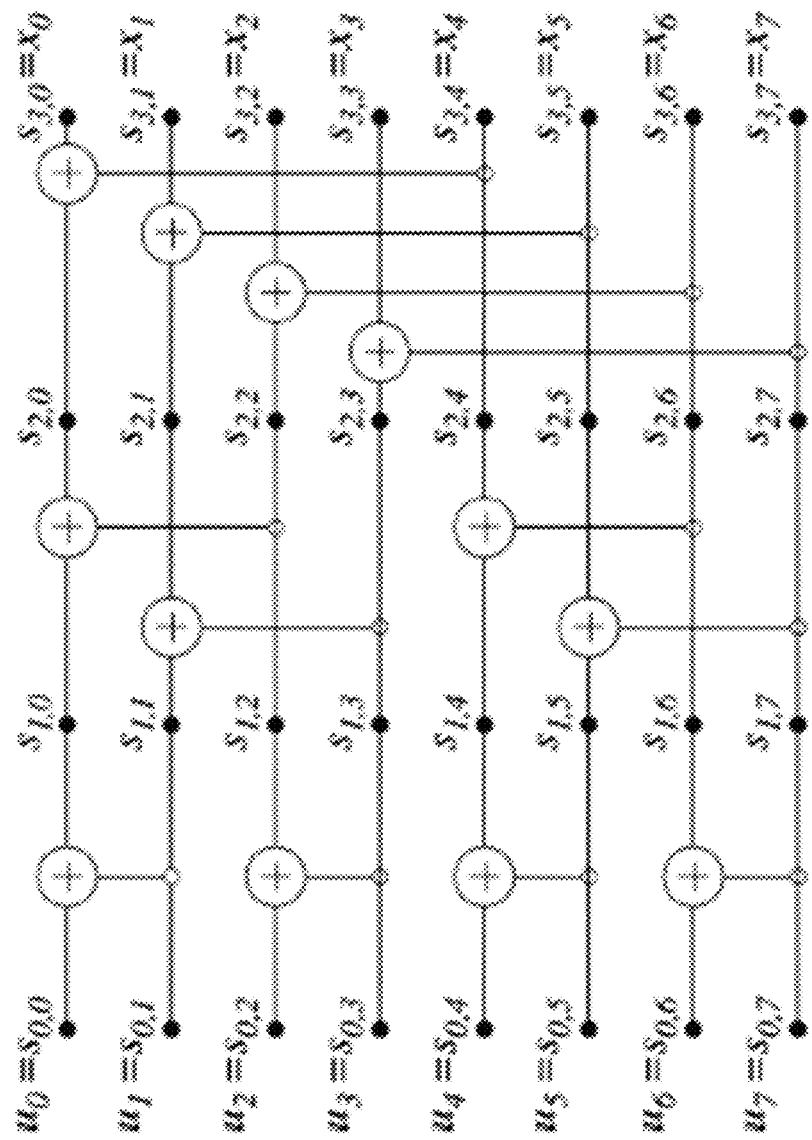
FIG. 2 illustrates labelling of intermediate bits in a polar code encoder with N=8.
Figure 3:
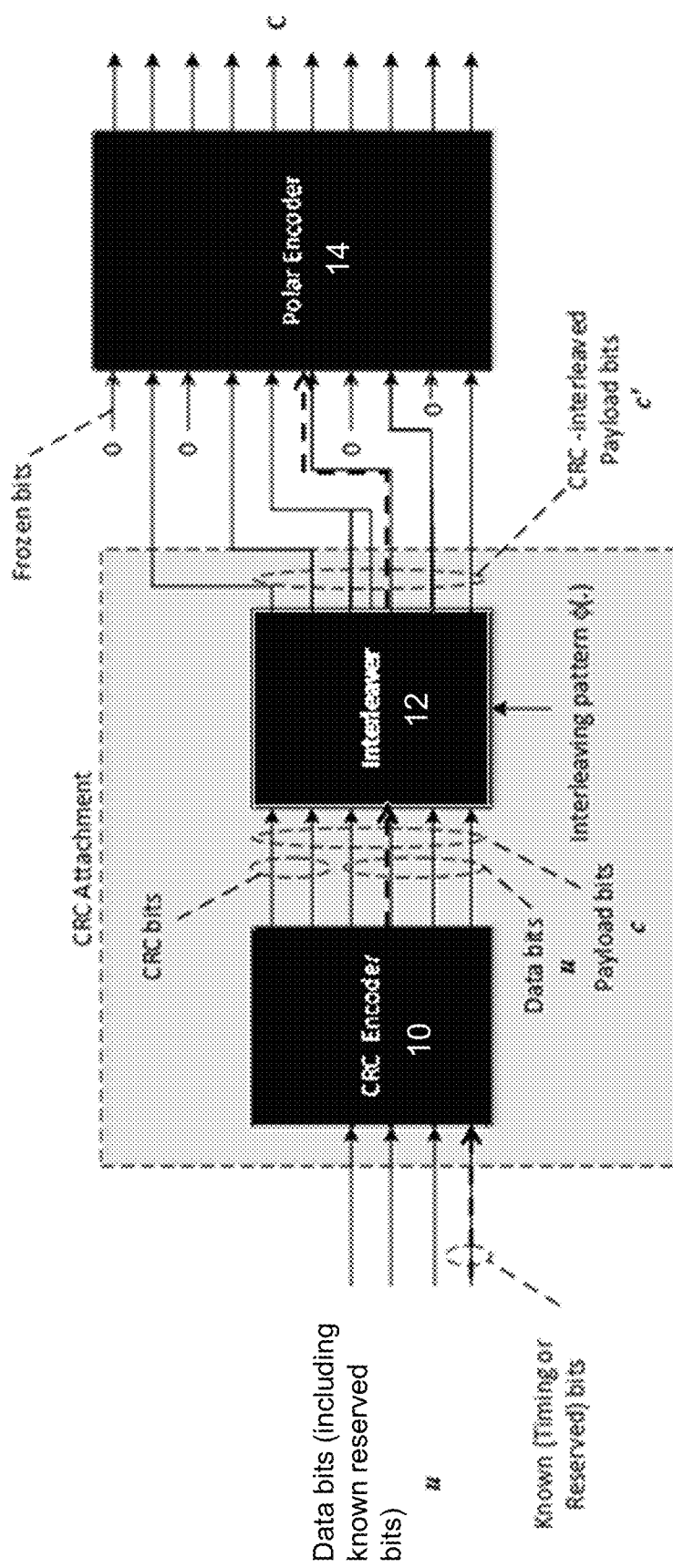
FIG. 3 is a block diagram illustrating basic polar coding with distributed CRC and known reserved bits embedded'
Figure 4:
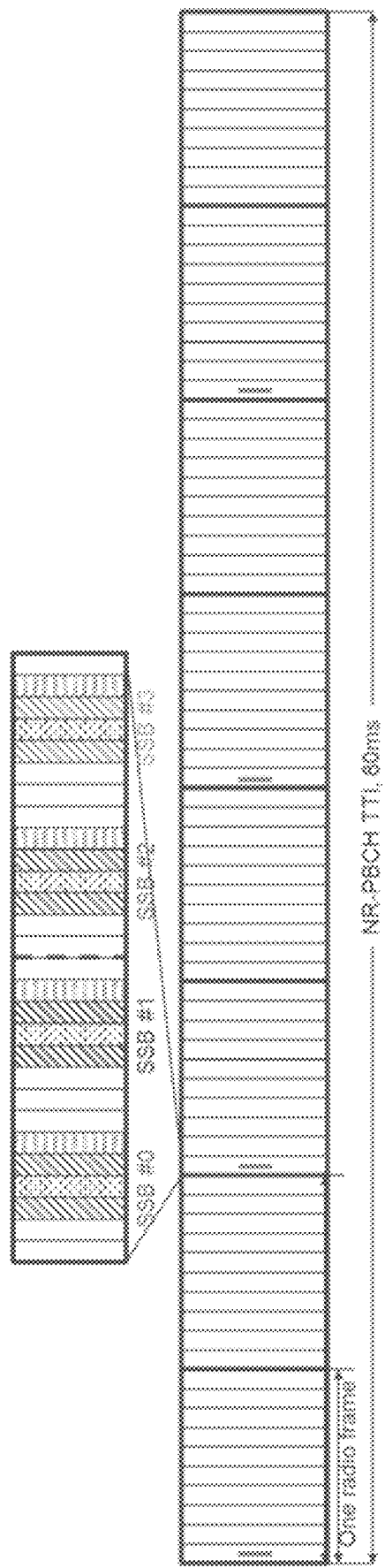
FIG. 4 illustrates an example of system information broadcast together with a reference synchronization signal (SS) through beam sweeping.
Figure 5:
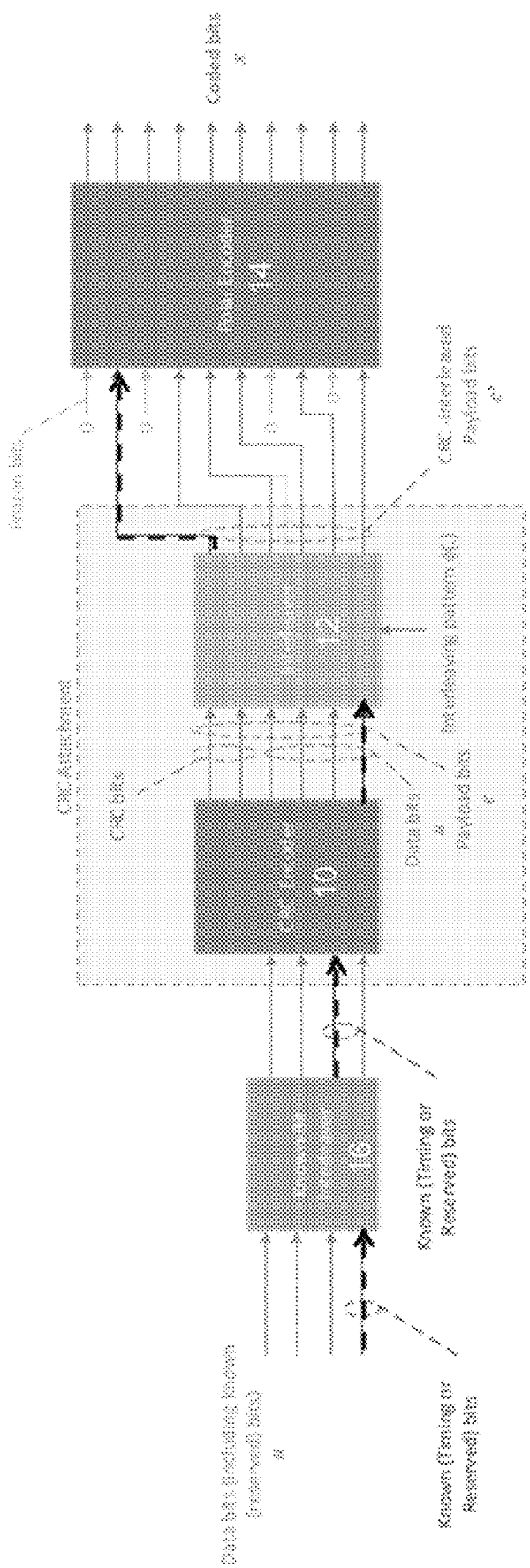
FIG. 5 is a block diagram illustrating an example known bit interleaver, according to particular embodiments.

FIG. 5 is a block diagram illustrating an example known-bit interleaver, according to particular embodiments. CRC encoder 10, interleaver 12, and polar encoder 14 are similar to CRC encoder 10, interleaver 12, and polar encoder 14 described with respect to FIG. 3. Known-bit interleaver 16 interleaves known timing and/or reserved bits to compensate for the effect of bit-channel reliability ordering and CRC interleaving so that the known or partially known (e.g., reserved) bits can be placed in an advantageous position for the polar decoder to enhance performance according to one or multiple criteria (e.g., early termination gain, enhanced error performance, etc.).

Figure 23:
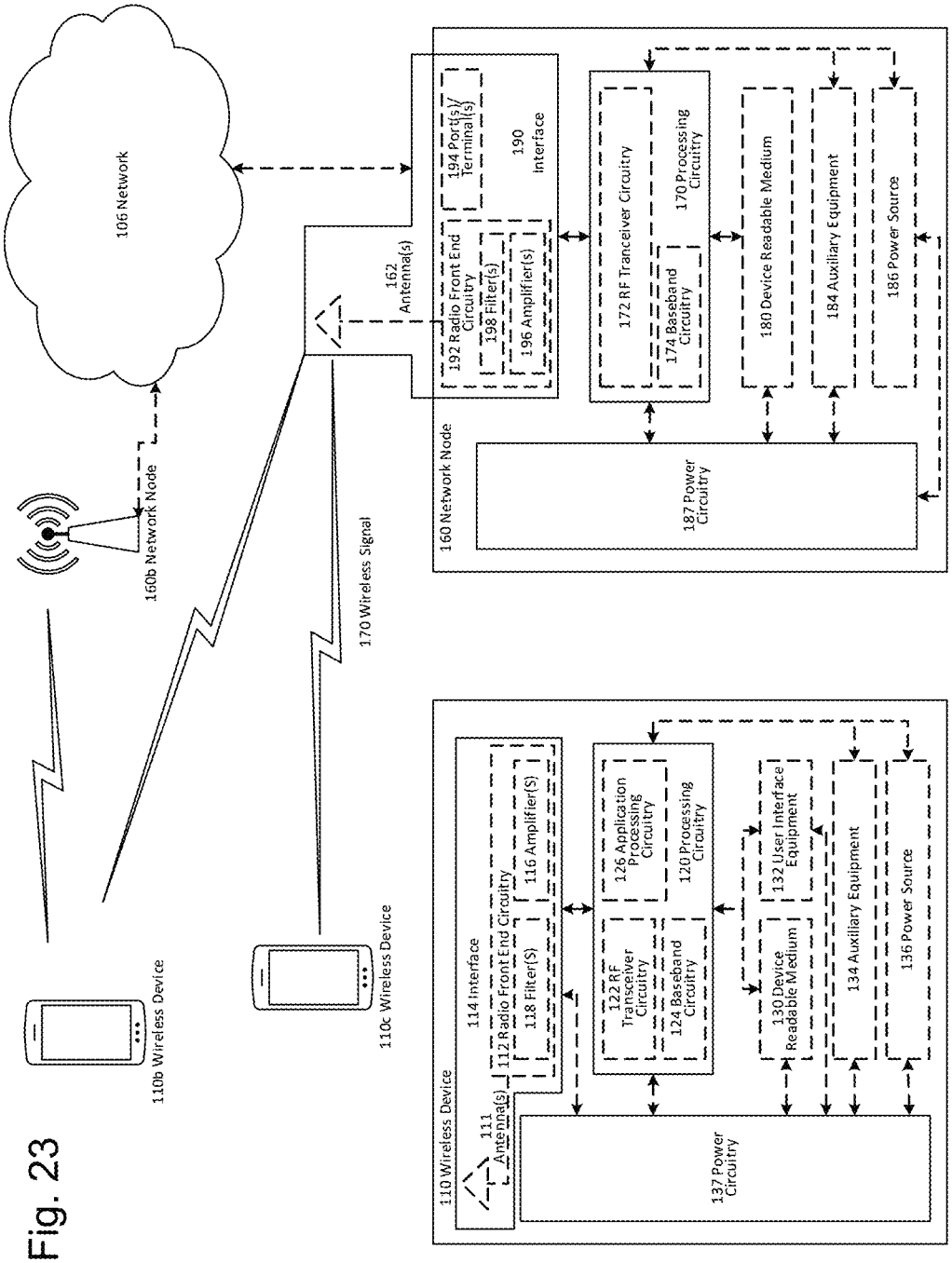
FIG. 23 is a block diagram illustrating an example wireless network.

Network components, such as wireless device 110 and network node 160 described with respect to FIG. 23, may include the components illustrated in FIG. 5. The components of FIG. 5 may be included in the transceiver circuitry described with respect to FIG. 5, and may comprise any suitable combination of one or more of a microprocessor, controller, microcontroller, central processing unit, digital signal processor, application-specific integrated circuit, field programmable gate array, or any other suitable computing device, resource, or combination of hardware, software and/or encoded logic operable to perform the steps described herein.

Particular embodiments may be described generally by the following known-bit placement procedure. A first step includes identifying payload bits of NR PBCH that have known values (typically all zero or some hypothesized values based on their relationship with adjacent blocks) and a first subset of the known (or partially known) bits that is suitable for achieving first performance criteria, such as an early decoding termination gain. The bits in the first subset of bits are placed accordingly to optimize the first performance criteria.

A second step includes identifying a second subset of the rest of the known bits that is suitable for achieving the second performance criteria. The second subset of bits are placed accordingly to optimize the second performance criteria.

The method may return to the first step above until all performance criteria have been addressed. If known bits remain, they may be placed arbitrarily.

Particular embodiments place known or partially known bits, such as the timing bits (SFN, SS block time index, half frame indicator, etc.) or the reserved bits to achieve both early termination benefits and error performance enhancements. In this case, the above procedure can be described as the following.

A first step includes selecting a subset of known or partially known bits, such as the SS Block Time index, that is suitable to improve the early termination gain and then place the bits at the bit positions that will be decoded earliest. In PBCH in 5G NR for example, the bit positions can be determined by the CRC interleaver mapping $\Pi$: $\{0, 1, \ldots, K-1\} \rightarrow \{0, 1, \ldots, K-1\}$, where K=56 is the number of payload plus CRC bits. For example, when a set of S known bits are selected, then these bits are placed at locations with indices in the image set $\Pi(\{0, 1, \ldots, S-1\})$ at the input of the CRC interleaver.

A second step includes placing the rest of the known (or partially known) bits, such as half frame indicator, SFN, and unknown bits, such as RMSI configuration, according to the reliability order based on the mapping $Q_0^{N-1}$: $\{0, 1, \ldots, N-1\} \rightarrow \{0, 1, \ldots, N-1\}$ (or $W(.)$) and $\Pi$: $\{0, 1, \ldots, K-1\} \rightarrow \{0, 1, \ldots, K-1\}$. Specifically, for example, the rest of the (K−S) soft bits are placed at locations with indices in the image set $\Pi(\phi_N(Q_0^{N-1}\{N-S, N-S+1, \ldots, N-1\}))\backslash\{0, 1, \ldots, S-1\})$ at the input of the CRC interleaver, where $\phi_N$: $Q_0^{N-1}(\{N-S, N-S+1, \ldots, N-1\}) \rightarrow \{0, 1, \ldots, K-1\}$ is a monotonic increasing bijective mapping.

Particular embodiments include specific known-bit placement for PBCH in 5G-NR. For the specific system of 5G-NR, particular embodiments may use various sets of known-bit placement strategies as described herein. A direct known-bit mapping for each known bit to an index at the input of CRC interleaver is presented in the associated table below for each set of known-bit placement strategies.

Example 1a

Known bits are placed at the earliest decoding positions to achieve early termination benefits:

| PBCH Bit Fields | Indices for Placement before CRC Interleaver |
|---|---|
| SS Block Time Index (3 bits); | [0, 2, 3] |

Figure 6:
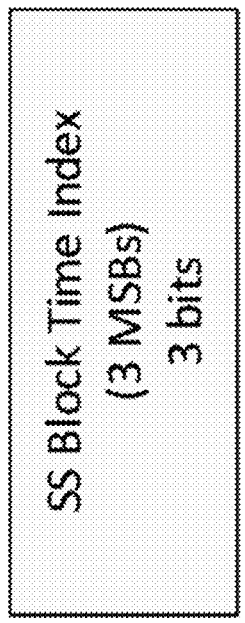
FIG. 6 illustrates a set of known bits to be placed in the earliest decoding positions, according to particular embodiments.

An example is illustrated in FIG. 6. FIG. 6 illustrates a set of known bits to be placed in the earliest decoding positions, according to a particular embodiment.

Known bits to be placed at the least reliable positions to achieve error performance enhancements after placing the above bits:

| PBCH Bit Fields | Indices for Placement before CRC Interleaver |
|---|---|
| SFN ($2^{nd}$, $3^{rd}$ LSBs) (2 bits); | 24, 6 |
| Half Frame Indication (1 bit) | 7 |
| SFN ($1^{st}$, $4^{th}$, $5^{th}$, ..., $9^{th}$, $10^{th}$ LSBs) (8 bits) | 10, 30, 8, 17, 18, 23, 16, 20, |
| Other PBCH Fields (42 bits) | 11, 19, 29, 28, 25, 21, 35, 4, 12, 41, 37, 26, 14, 42, 31, 13, 44, 32, 22, 34, 48, 5, 27, 36, 33, 15, 38, 43, 46, 39, 45, 1, 49, 50, 9, 52, 40, 47, 51, 53, 54, 55 |

Figure 7:
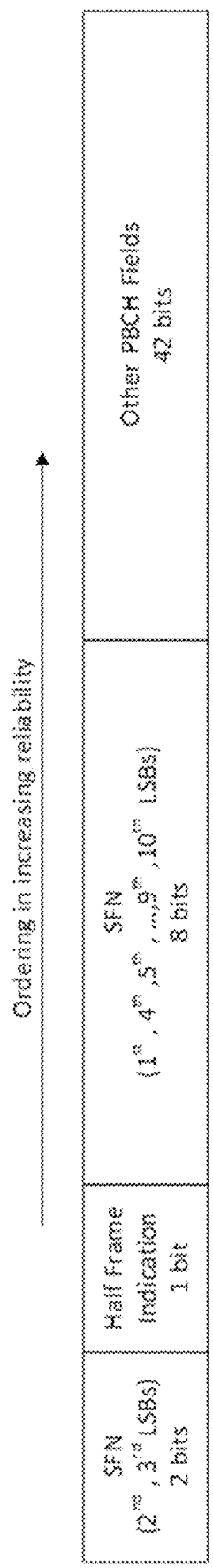

An example is illustrated in FIG. 7. FIG. 7 illustrates a set of known bits to be placed in the bit positions with lowest reliabilities, according to a particular embodiment.

Example 1b

Known bits to be placed at the earliest decoding positions to achieve early termination benefits (an example is illustrated in FIG. 6):

| PBCH Bit Fields | Indices for Placement before CRC Interleaver |
|---|---|
| SS Block Time Index (3 bits); | [0 2 3] |

Known bits to be placed at the least reliable positions to achieve error performance enhancements after placing the above bits:

| PBCH Bit Fields | Indices for Placement before CRC Interleaver |
|---|---|
| SFN ($2^{nd}$, $3^{rd}$ LSBs) (2 bits); | 24 6 |
| SFN ($1^{st}$, $4^{th}$, $5^{th}$, ..., $9^{th}$, $10^{th}$ LSBs) (8 bits) | 7 10 30 8 17 18 23 16 |
| Half Frame Indication (1 bit) | 20 |
| Other PBCH Fields (42 bits) | 11 19 29 28 25 21 35 4 12 41 37 26 14 42 31 13 44 32 22 34 48 5 27 36 33 15 38 43 46 39 45 1 49 50 9 52 40 47 51 53 54 55 |

An example is illustrated in FIG. 8. FIG. 8 illustrates another set of known bits to be placed in the bit positions with lowest reliabilities, according to a particular embodiment.

Example 1c

Known bits to be placed at the earliest decoding positions to achieve early termination benefits (an example is illustrated in FIG. 6):

| PBCH Bit Fields | Indices for Placement before CRC Interleaver |
|---|---|
| SS Block Time Index (3 bits); | [0 2 3] |

Known bits to be placed at the least reliable positions to achieve error performance enhancements after placing the above bits:

| PBCH Bit Fields | Indices for Placement before CRC Interleaver |
|---|---|
| Half Frame Indication (1 bit) | 24 |
| SFN ($2^{nd}$, $3^{rd}$ LSBs) (2 bits); | 6 7 |
| SFN ($1^{st}$, $4^{th}$, $5^{th}$, ..., $9^{th}$, $10^{th}$ LSBs) (8 bits) | 10 30 8 17 18 23 16 20 |
| Other PBCH Fields (42 bits) | 11 19 29 28 25 21 35 4 12 41 37 26 14 42 31 13 44 32 22 34 48 5 27 36 33 15 38 43 46 39 45 1 49 50 9 52 40 47 51 53 54 55 |

An example is illustrated in FIG. 9. FIG. 9 illustrates another set of known bits to be placed in the bit positions with lowest reliabilities, according to a particular embodiment.

Example 1d

Known bits to be placed at the earliest decoding positions (to achieve early termination benefits) (FIG. 6):

| PBCH Bit Fields | Indices for Placement before CRC Interleaver |
|---|---|
| SS Block Time Index (3 bits); | [0 2 3] |

Known bits to be placed at the least reliable positions (to achieve error performance enhancements) after placing the above bits:

| PBCH Bit Fields | Indices for Placement before CRC Interleaver |
|---|---|
| Half Frame Indication (1 bit) | 24 |
| SFN ($1^{st}$, $4^{th}$, $5^{th}$, ..., $9^{th}$, $10^{th}$ LSBs) (8 bits) | 6 7 10 30 8 17 18 23 |
| SFN ($2^{nd}$, $3^{rd}$ LSBs) (2 bits) | 16 20 |
| Other PBCH Fields (42 bits) | 11 19 29 28 25 21 35 4 12 41 37 26 14 42 31 13 44 32 22 34 48 5 27 36 33 15 38 43 46 39 45 1 49 50 9 52 40 47 51 53 54 55 |

An example is illustrated in FIG. 10. FIG. 10 illustrates another set of known bits to be placed in the bit positions with lowest reliabilities, according to a particular embodiment.

Example 1e

Known bits to be placed at the earliest decoding positions (to achieve early termination benefits) (FIG. 6):

| PBCH Bit Fields | Indices for Placement before CRC Interleaver |
|---|---|
| SS Block Time Index (3 bits); | [0 2 3] |

Known bits to be placed at the least reliable positions (to achieve error performance enhancements) after placing the above bits:

| PBCH Bit Fields | Indices for Placement before CRC Interleaver |
|---|---|
| SFN ($1^{st}$, $4^{th}$, $5^{th}$, ..., $9^{th}$, $10^{th}$ LSBs) (8 bits) | 24 6 7 10 30 8 17 18 |
| SFN ($2^{nd}$, $3^{rd}$ LSBs) (2 bits); | 23 16 |
| Half Frame Indication (1 bit) | 20 |
| Other PBCH Fields (42 bits) | 11 19 29 28 25 21 35 4 12 41 37 26 14 42 31 13 44 32 22 34 48 5 27 36 33 15 38 43 46 39 45 1 49 50 9 52 40 47 51 53 54 55 |

An example is illustrated in FIG. 11. FIG. 11 illustrates another set of known bits to be placed in the bit positions with lowest reliabilities, according to a particular embodiment.

Example 1f

Known bits to be placed at the earliest decoding positions (to achieve early termination benefits) (FIG. 6):

| PBCH Bit Fields | Indices for Placement before CRC Interleaver |
|---|---|
| SS Block Time Index (3 bits); | [0 2 3] |

Known bits to be placed at the least reliable positions (to achieve error performance enhancements) after placing the above bits:

| PBCH Bit Fields | Indices for Placement before CRC Interleaver |
|---|---|
| SFN ($1^{st}$, $4^{th}$, $5^{th}$, ..., $9^{th}$, $10^{th}$ LSBs) (8 bits) | 24 6 7 10 30 8 17 18 |
| Half Frame Indication (1 bit) | 23 |
| SFN ($2^{nd}$, $3^{rd}$ LSBs) (2 bits); | 16 20 |
| Other PBCH Fields (42 bits) | 11 19 29 28 25 21 35 4 12 41 37 26 14 42 31 13 44 32 22 34 48 5 27 36 33 15 38 43 46 39 45 1 49 50 9 52 40 47 51 53 54 55 |

An example is illustrated in FIG. 12. FIG. 12 illustrates another set of known bits to be placed in the bit positions with lowest reliabilities, according to a particular embodiment.

Example 1g

Known bits to be placed at the earliest decoding positions (to achieve early termination benefits) (FIG. 6):

| PBCH Bit Fields | Indices for Placement before CRC Interleaver |
|---|---|
| SS Block Time Index (3 bits); | [0 2 3] |

Known bits to be placed at the least reliable positions (to achieve error performance enhancements) after placing the above bits:

| PBCH Bit Fields | Indices for Placement before CRC Interleaver |
|---|---|
| Half Frame Indication (1 bit) | 24 |
| SFN ($1^{st}$, $2^{nd}$, $3^{rd}$, ..., $4^{th}$, $5^{th}$, ..., $9^{th}$, $10^{th}$ LSBs) (10 bits) | 6 7 10 30 8 17 18 23 16 20 |
| Other PBCH Fields (42 bits) | 11 19 29 28 25 21 35 4 12 41 37 26 14 42 31 13 44 32 22 34 48 5 27 36 33 15 38 43 46 39 45 1 49 50 9 52 40 47 51 53 54 55 |

An example is illustrated in FIG. 13. FIG. 13 illustrates another set of known bits to be placed in the bit positions with lowest reliabilities, according to a particular embodiment.

Example 1h

Known bits to be placed at the earliest decoding positions (to achieve early termination benefits) (FIG. 6):

| PBCH Bit Fields | Indices for Placement before CRC Interleaver |
|---|---|
| SS Block Time Index (3 bits); | [0 2 3] |

Known bits to be placed at the least reliable positions (to achieve error performance enhancements) after placing the above bits:

| PBCH Bit Fields | Indices for Placement before CRC Interleaver |
|---|---|
| Half Frame Indication (1 bit) | 24 |
| SFN (1st, 2nd, 3rd, 4th, 5th, ..., 9th, 10th LSBs) (10 bits) | 6 7 10 30 8 17 18 23 16 20 |
| Other PBCH Fields (42 bits) | 11 19 29 28 25 21 35 4 12 41 37 26 14 42 31 13 44 32 22 34 48 5 27 36 33 15 38 43 46 39 45 1 49 50 9 52 40 47 51 53 54 55 |

Figure 14:
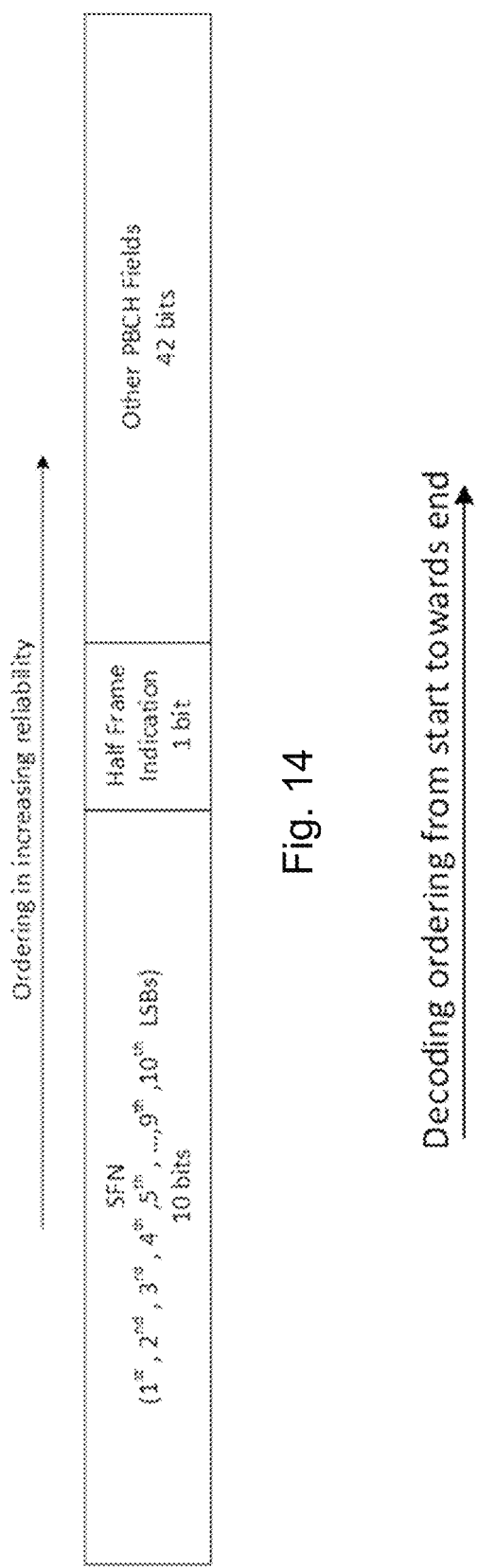

An example is illustrated in FIG. 14. FIG. 14 illustrates another set of known bits to be placed in the bit positions with lowest reliabilities, according to a particular embodiment.

Example 2a

Figure 15:
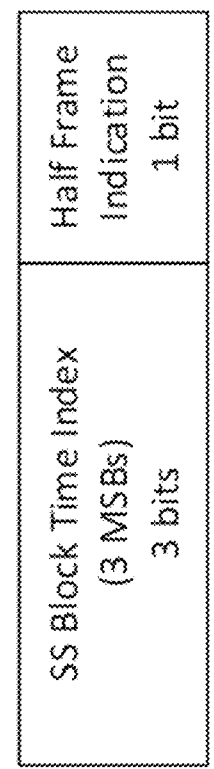
FIG. 15 illustrates another set of known bits to be placed in the earliest decoding positions, according to particular embodiments.

Known bits to be placed at the earliest decoding positions (to achieve early termination benefits (FIG. 15):

| PBCH Bit Fields | Indices for Placement before CRC Interleaver |
|---|---|
| SS Block Time Index (3 bits); | [0 2 3] |
| Half Frame Indication (1 bit) | 5 |

Known bits to be placed at the least reliable positions (to achieve error performance enhancements) after placing the above bits:

| PBCH Bit Fields | Indices for Placement before CRC Interleaver |
|---|---|
| SFN ($2^{nd}$, $3^{rd}$ LSBs) (2 bits); | 24, 6 |
| SFN ($1^{st}$, $4^{th}$, $5^{th}$, ..., $9^{th}$, $10^{th}$ LSBs) (8 bits) | 7, 10, 30, 8, 17, 18, 23, 16, |
| Other PBCH Fields (42 bits) | 20, 11, 19, 29, 28, 25, 21, 35, 4, 12, 41, 37, 26, 14, 42, 31, 13, 44, 32, 22, 34, 48, 27, 36, 33, 15, 38, 43, 46, 39, 45, 1, 49, 50, 9, 52, 40, 47, 51, 53, 54, 55 |

Figures 16, 17:
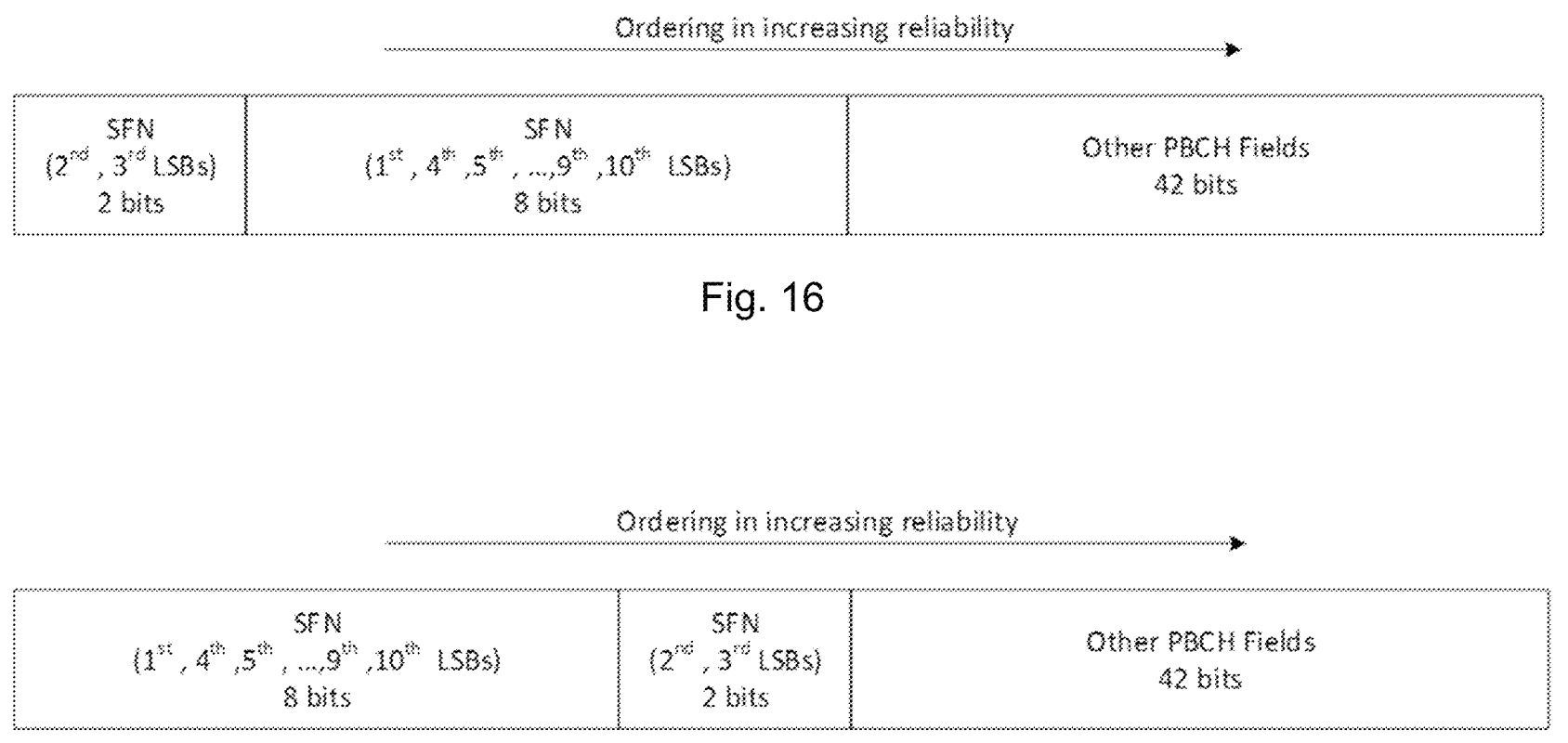

An example is illustrated in FIG. 16. FIG. 16 illustrates another set of known bits to be placed in the bit positions with lowest reliabilities, according to a particular embodiment.

Example 2b

Known bits to be placed at the earliest decoding positions (to achieve early termination benefits (FIG. 15):

| PBCH Bit Fields | Indices for Placement before CRC Interleaver |
|---|---|
| SS Block Time Index (3 bits); | [0 2 3] |
| Half Frame Indication (1 bit) | 5 |

Known bits to be placed at the least reliable positions (to achieve error performance enhancements) after placing the above bits:

| PBCH Bit Fields | Indices for Placement before CRC Interleaver |
|---|---|
| SFN ($1^{st}$, $4^{th}$, $5^{th}$, ..., $9^{th}$, $10^{th}$ LSBs) (8 bits) | 24, 6, 7, 10, 30, 8, 17, 18, |
| SFN ($2^{nd}$, $3^{rd}$ LSBs) (2 bits) | 23, 16 |
| Other PBCH Fields (42 bits) | 20, 11, 19, 29, 28, 25, 21, 35, 4, 12, 41, 37, 26, 14, 42, 31, 13, 44, 32, 22, 34, 48, 27, 36, 33, 15, 38, 43, 46, 39, 45, 1, 49, 50, 9, 52, 40, 47, 51, 53, 54, 55 |

An example is illustrated in FIG. 17. FIG. 17 illustrates another set of known bits to be placed in the bit positions with lowest reliabilities, according to a particular embodiment.

Example 2c

Known bits to be placed at the earliest decoding positions (to achieve early termination benefits (FIG. 15):

| PBCH Bit Fields | Indices for Placement before CRC Interleaver |
|---|---|
| SS Block Time Index (3 bits); | [0 2 3] |
| Half Frame Indication (1 bit) | 5 |

Known bits to be placed at the least reliable positions (to achieve error performance enhancements) after placing the above bits:

| PBCH Bit Fields | Indices for Placement before CRC Interleaver |
|---|---|
| SFN ($1^{st}$, $2^{nd}$, $3^{rd}$, $4^{th}$, $5^{th}$, ..., $9^{th}$, $10^{th}$ LSBs) (10 bits) | 24, 6, 7, 10, 30, 8, 17, 18, 23, 16, |
| Other PBCH Fields (42 bits) | 20, 11, 19, 29, 28, 25, 21, 35, 4, 12, 41, 37, 26, 14, 42, 31, 13, 44, 32, 22, 34, 48, 27, 36, 33, 15, 38, 43, 46, 39, 45, 1, 49, 50, 9, 52, 40, 47, 51, 53, 54, 55 |

Figure 18:
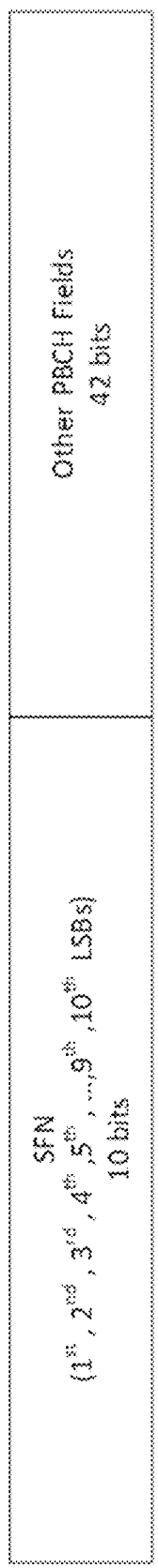

An example is illustrated in FIG. 18. FIG. 18 illustrates another set of known bits to be placed in the bit positions with lowest reliabilities, according to a particular embodiment.

Example 3a

Figure 19:
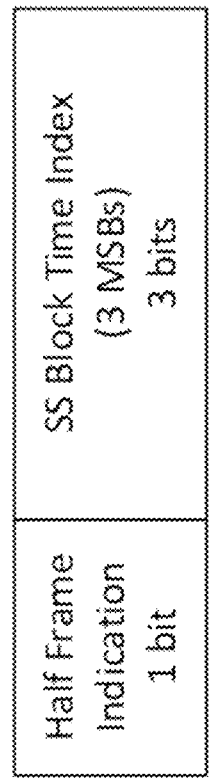
FIG. 19 illustrates another set of known bits to be placed in the earliest decoding positions, according to particular embodiments.

Known bits to be placed at the earliest decoding positions (to achieve early termination benefits (FIG. 19):

| PBCH Bit Fields | Indices for Placement before CRC Interleaver |
|---|---|
| Half Frame Indication (1 bit); | 0 |
| SS Block Time Index (3 bits) | [2 3 5] |

Known bits to be placed at the least reliable positions (to achieve error performance enhancements) after placing the above bits:

| PBCH Bit Fields | Indices for Placement before CRC Interleaver |
|---|---|
| SFN ($2^{nd}$, $3^{rd}$ LSBs) (2 bits); | 24, 6 |
| SFN ($1^{st}$, $4^{th}$, $5^{th}$, ..., $9^{th}$, $10^{th}$ LSBs) (8 bits) | 7, 10, 30, 8, 17, 18, 23, 16, |
| Other PBCH Fields (42 bits) | 20, 11, 19, 29, 28, 25, 21, 35, 4, 12, 41, 37, 26, 14, 42, 31, 13, 44, 32, 22, 34, 48, 27, 36, 33, 15, 38, 43, 46, 39, 45, 1, 49, 50, 9, 52, 40, 47, 51, 53, 54, 55 |

An example is illustrated in FIG. 20. FIG. 20 illustrates another set of known bits to be placed in the bit positions with lowest reliabilities, according to a particular embodiment.

Example 3b

Known bits to be placed at the earliest decoding positions (to achieve early termination benefits (FIG. 19):

| PBCH Bit Fields | Indices for Placement before CRC Interleaver |
|---|---|
| Half Frame Indication (1 bit); | 0 |
| SS Block Time Index (3 bits) | [2 3 5] |

Known bits to be placed at the least reliable positions (to achieve error performance enhancements) after placing the above bits:

| PBCH Bit Fields | Indices for Placement before CRC Interleaver |
| --- | --- |
| SFN ($1^{st}$, $4^{th}$, $5^{th}$, ..., $9^{th}$, $10^{th}$ LSBs) (8 bits) | 24, 6, 7, 10, 30, 8, 17, 18, |
| SFN ($2^{nd}$, $3^{rd}$ LSBs) (2 bits) | 23, 16 |
| Other PBCH Fields (42 bits) | 20, 11, 19, 29, 28, 25, 21, 35, 4, 12, 41, 37, 26, 14, 42, 31, 13, 44, 32, 22, 34, 48, 27, 36, 33, 15, 38, 43, 46, 39, 45, 1, 49, 50, 9, 52, 40, 47, 51, 53, 54, 55 |

An example is illustrated in FIG. 21. FIG. 21 illustrates another set of known bits to be placed in the bit positions with lowest reliabilities, according to a particular embodiment.

Example 3c

Known bits to be placed at the earliest decoding positions (to achieve early termination benefits (FIG. 19):

| PBCH Bit Fields | Indices for Placement before CRC Interleaver |
| --- | --- |
| Half Frame Indication (1 bit); SS Block Time Index (3 bits) | 0 [2 3 5] |

Known bits to be placed at the least reliable positions (to achieve error performance enhancements) after placing the above bits:

| PBCH Bit Fields | Indices for Placement before CRC Interleaver |
| --- | --- |
| SFN ($1^{st}$, $2^{nd}$, $3^{rd}$, $4^{th}$, $5^{th}$, ..., $9^{th}$, $10^{th}$ LSBs) (10 bits) | 24, 6, 7, 10, 30, 8, 17, 18, 23, 16, |
| Other PBCH Fields (42 bits) | 20, 11, 19, 29, 28, 25, 21, 35, 4, 12, 41, 37, 26, 14, 42, 31, 13, 44, 32, 22, 34, 48, 27, 36, 33, 15, 38, 43, 46, 39, 45, 1, 49, 50, 9, 52, 40, 47, 51, 53, 54, 55 |

Figure 22:
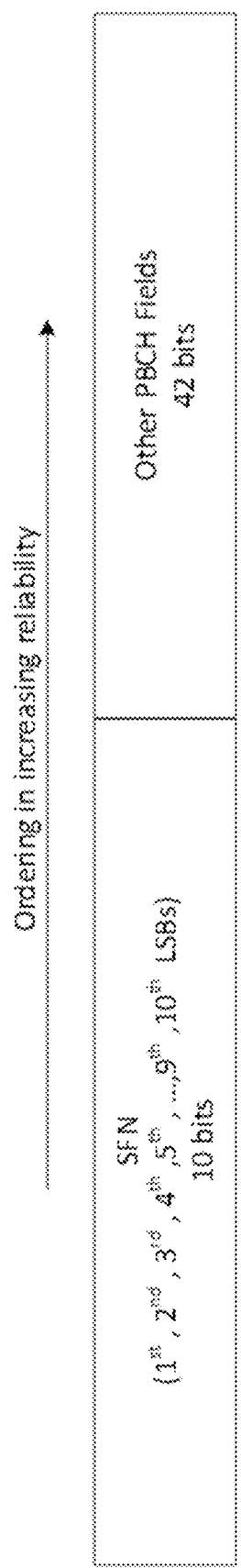

An example is illustrated in FIG. 22. FIG. 22 illustrates another set of known bits to be placed in the bit positions with lowest reliabilities, according to a particular embodiment.

FIG. 23 illustrates an example wireless network, according to certain embodiments. The wireless network may comprise and/or interface with any type of communication, telecommunication, data, cellular, and/or radio network or other similar type of system. In some embodiments, the wireless network may be configured to operate according to specific standards or other types of predefined rules or procedures. Thus, particular embodiments of the wireless network may implement communication standards, such as Global System for Mobile Communications (GSM), Universal Mobile Telecommunications System (UMTS), Long Term Evolution (LTE), and/or other suitable 2G, 3G, 4G, or 5G standards; wireless local area network (WLAN) standards, such as the IEEE 802.11 standards; and/or any other appropriate wireless communication standard, such as the Worldwide Interoperability for Microwave Access (WiMax), Bluetooth, Z-Wave and/or ZigBee standards.

Network 106 may comprise one or more backhaul networks, core networks, IP networks, public switched telephone networks (PSTNs), packet data networks, optical networks, wide-area networks (WANs), local area networks (LANs), wireless local area networks (WLANs), wired networks, wireless networks, metropolitan area networks, and other networks to enable communication between devices.

Network node 160 and WD 110 comprise various components described in more detail below. These components work together to provide network node and/or wireless device functionality, such as providing wireless connections in a wireless network. In different embodiments, the wireless network may comprise any number of wired or wireless networks, network nodes, base stations, controllers, wireless devices, relay stations, and/or any other components or systems that may facilitate or participate in the communication of data and/or signals whether via wired or wireless connections.

As used herein, network node refers to equipment capable, configured, arranged and/or operable to communicate directly or indirectly with a wireless device and/or with other network nodes or equipment in the wireless network to enable and/or provide wireless access to the wireless device and/or to perform other functions (e.g., administration) in the wireless network. Examples of network nodes include, but are not limited to, access points (APs) (e.g., radio access points), base stations (BSs) (e.g., radio base stations, Node Bs, evolved Node Bs (eNBs) and NR NodeBs (gNBs)). Base stations may be categorized based on the amount of coverage they provide (or, stated differently, their transmit power level) and may then also be referred to as femto base stations, pico base stations, micro base stations, or macro base stations. A base station may be a relay node or a relay donor node controlling a relay. A network node may also include one or more (or all) parts of a distributed radio base station such as centralized digital units and/or remote radio units (RRUs), sometimes referred to as Remote Radio Heads (RRHs). Such remote radio units may or may not be integrated with an antenna as an antenna integrated radio. Parts of a distributed radio base station may also be referred to as nodes in a distributed antenna system (DAS). Yet further examples of network nodes include multi-standard radio (MSR) equipment such as MSR BSs, network controllers such as radio network controllers (RNCs) or base station controllers (BSCs), base transceiver stations (BTSs), transmission points, transmission nodes, multi-cell/multicast coordination entities (MCEs), core network nodes (e.g., MSCs, MMEs), O&M nodes, OSS nodes, SON nodes, positioning nodes (e.g., E-SMLCs), and/or MDTs. As another example, a network node may be a virtual network node as described in more detail below. More generally, however, network nodes may represent any suitable device (or group of devices) capable, configured, arranged, and/or operable to enable and/or provide a wireless device with access to the wireless network or to provide some service to a wireless device that has accessed the wireless network.

In FIG. 23, network node 160 includes processing circuitry 170, device readable medium 180, interface 190, auxiliary equipment 184, power source 186, power circuitry 187, and antenna 162. Although network node 160 illustrated in the example wireless network of FIG. 23 may represent a device that includes the illustrated combination of hardware components, other embodiments may comprise network nodes with different combinations of components. It is to be understood that a network node comprises any suitable combination of hardware and/or software needed to perform the tasks, features, functions and methods disclosed herein. Moreover, while the components of network node 160 are depicted as single boxes located within a larger box, or nested within multiple boxes, in practice, a network node may comprise multiple different physical components that make up a single illustrated component (e.g., device readable medium 180 may comprise multiple separate hard drives as well as multiple RAM modules).

Similarly, network node 160 may be composed of multiple physically separate components (e.g., a NodeB component and a RNC component, or a BTS component and a BSC component, etc.), which may each have their own respective components. In certain scenarios in which network node 160 comprises multiple separate components (e.g., BTS and BSC components), one or more of the separate components may be shared among several network nodes. For example, a single RNC may control multiple NodeB's. In such a scenario, each unique NodeB and RNC pair, may in some instances be considered a single separate network node.

In some embodiments, network node 160 may be configured to support multiple radio access technologies (RATs). In such embodiments, some components may be duplicated (e.g., separate device readable medium 180 for the different RATs) and some components may be reused (e.g., the same antenna 162 may be shared by the RATs). Network node 160 may also include multiple sets of the various illustrated components for different wireless technologies integrated into network node 160, such as, for example, GSM, WCDMA, LTE, NR, WiFi, or Bluetooth wireless technologies. These wireless technologies may be integrated into the same or different chip or set of chips and other components within network node 160.

Processing circuitry 170 is configured to perform any determining, calculating, or similar operations (e.g., certain obtaining operations) described herein as being provided by a network node. These operations performed by processing circuitry 170 may include processing information obtained by processing circuitry 170 by, for example, converting the obtained information into other information, comparing the obtained information or converted information to information stored in the network node, and/or performing one or more operations based on the obtained information or converted information, and as a result of said processing making a determination.

Processing circuitry 170 may comprise a combination of one or more of a microprocessor, controller, microcontroller, central processing unit, digital signal processor, application-specific integrated circuit, field programmable gate array, or any other suitable computing device, resource, or combination of hardware, software and/or encoded logic operable to provide, either alone or in conjunction with other network node 160 components, such as device readable medium 180, network node 160 functionality.

For example, processing circuitry 170 may execute instructions stored in device readable medium 180 or in memory within processing circuitry 170. Such functionality may include providing any of the various wireless features, functions, or benefits discussed herein. In some embodiments, processing circuitry 170 may include a system on a chip (SOC).

In some embodiments, processing circuitry 170 may include one or more of radio frequency (RF) transceiver circuitry 172 and baseband processing circuitry 174. In some embodiments, radio frequency (RF) transceiver circuitry 172 and baseband processing circuitry 174 may be on separate chips (or sets of chips), boards, or units, such as radio units and digital units. In alternative embodiments, part or all of RF transceiver circuitry 172 and baseband processing circuitry 174 may be on the same chip or set of chips, boards, or units In certain embodiments, some or all of the functionality described herein as being provided by a network node, base station, eNB or other such network device may be performed by processing circuitry 170 executing instructions stored on device readable medium 180 or memory within processing circuitry 170. In alternative embodiments, some or all of the functionality may be provided by processing circuitry 170 without executing instructions stored on a separate or discrete device readable medium, such as in a hard-wired manner. In any of those embodiments, whether executing instructions stored on a device readable storage medium or not, processing circuitry 170 can be configured to perform the described functionality. The benefits provided by such functionality are not limited to processing circuitry 170 alone or to other components of network node 160 but are enjoyed by network node 160 as a whole, and/or by end users and the wireless network generally.

Device readable medium 180 may comprise any form of volatile or non-volatile computer readable memory including, without limitation, persistent storage, solid-state memory, remotely mounted memory, magnetic media, optical media, random access memory (RAM), read-only memory (ROM), mass storage media (for example, a hard disk), removable storage media (for example, a flash drive, a Compact Disk (CD) or a Digital Video Disk (DVD)), and/or any other volatile or non-volatile, non-transitory device readable and/or computer-executable memory devices that store information, data, and/or instructions that may be used by processing circuitry 170. Device readable medium 180 may store any suitable instructions, data or information, including a computer program, software, an application including one or more of logic, rules, code, tables, etc. and/or other instructions capable of being executed by processing circuitry 170 and, utilized by network node 160. Device readable medium 180 may be used to store any calculations made by processing circuitry 170 and/or any data received via interface 190. In some embodiments, processing circuitry 170 and device readable medium 180 may be considered to be integrated.

Interface 190 is used in the wired or wireless communication of signaling and/or data between network node 160, network 106, and/or WDs 110. As illustrated, interface 190 comprises port(s)/terminal(s) 194 to send and receive data, for example to and from network 106 over a wired connection. Interface 190 also includes radio front end circuitry 192 that may be coupled to, or in certain embodiments a part of, antenna 162.

Radio front end circuitry 192 comprises filters 198 and amplifiers 196. Radio front end circuitry 192 may be connected to antenna 162 and processing circuitry 170. Radio front end circuitry may be configured to condition signals communicated between antenna 162 and processing circuitry 170. Radio front end circuitry 192 may receive digital data that is to be sent out to other network nodes or WDs via a wireless connection. Radio front end circuitry 192 may convert the digital data into a radio signal having the appropriate channel and bandwidth parameters using a combination of filters 198 and/or amplifiers 196. The radio signal may then be transmitted via antenna 162. Similarly, when receiving data, antenna 162 may collect radio signals which are then converted into digital data by radio front end circuitry 192. The digital data may be passed to processing circuitry 170. In other embodiments, the interface may comprise different components and/or different combinations of components.

In certain alternative embodiments, network node 160 may not include separate radio front end circuitry 192, instead, processing circuitry 170 may comprise radio front end circuitry and may be connected to antenna 162 without separate radio front end circuitry 192. Similarly, in some embodiments, all or some of RF transceiver circuitry 172 may be considered a part of interface 190. In still other embodiments, interface 190 may include one or more ports or terminals 194, radio front end circuitry 192, and RF transceiver circuitry 172, as part of a radio unit (not shown), and interface 190 may communicate with baseband processing circuitry 174, which is part of a digital unit (not shown).

Antenna 162 may include one or more antennas, or antenna arrays, configured to send and/or receive wireless signals. Antenna 162 may be coupled to radio front end circuitry 190 and may be any type of antenna capable of transmitting and receiving data and/or signals wirelessly. In some embodiments, antenna 162 may comprise one or more omni-directional, sector or panel antennas operable to transmit/receive radio signals between, for example, 2 GHz and 66 GHz. An omni-directional antenna may be used to transmit/receive radio signals in any direction, a sector antenna may be used to transmit/receive radio signals from devices within a particular area, and a panel antenna may be a line of sight antenna used to transmit/receive radio signals in a relatively straight line. In some instances, the use of more than one antenna may be referred to as MIMO. In certain embodiments, antenna 162 may be separate from network node 160 and may be connectable to network node 160 through an interface or port.

Antenna 162, interface 190, and/or processing circuitry 170 may be configured to perform any receiving operations and/or certain obtaining operations described herein as being performed by a network node. Any information, data and/or signals may be received from a wireless device, another network node and/or any other network equipment. Similarly, antenna 162, interface 190, and/or processing circuitry 170 may be configured to perform any transmitting operations described herein as being performed by a network node. Any information, data and/or signals may be transmitted to a wireless device, another network node and/or any other network equipment.

Power circuitry 187 may comprise, or be coupled to, power management circuitry and is configured to supply the components of network node 160 with power for performing the functionality described herein. Power circuitry 187 may receive power from power source 186. Power source 186 and/or power circuitry 187 may be configured to provide power to the various components of network node 160 in a form suitable for the respective components (e.g., at a voltage and current level needed for each respective component). Power source 186 may either be included in, or external to, power circuitry 187 and/or network node 160.

For example, network node 160 may be connectable to an external power source (e.g., an electricity outlet) via an input circuitry or interface such as an electrical cable, whereby the external power source supplies power to power circuitry 187. As a further example, power source 186 may comprise a source of power in the form of a battery or battery pack which is connected to, or integrated in, power circuitry 187. The battery may provide backup power should the external power source fail. Other types of power sources, such as photovoltaic devices, may also be used.

Alternative embodiments of network node 160 may include additional components beyond those shown in FIG. 23 that may be responsible for providing certain aspects of the network node's functionality, including any of the functionality described herein and/or any functionality necessary to support the subject matter described herein. For example, network node 160 may include user interface equipment to allow input of information into network node 160 and to allow output of information from network node 160. This may allow a user to perform diagnostic, maintenance, repair, and other administrative functions for network node 160.

As used herein, wireless device (WD) refers to a device capable, configured, arranged and/or operable to communicate wirelessly with network nodes and/or other wireless devices. Unless otherwise noted, the term WD may be used interchangeably herein with user equipment (UE). Communicating wirelessly may involve transmitting and/or receiving wireless signals using electromagnetic waves, radio waves, infrared waves, and/or other types of signals suitable for conveying information through air.

In some embodiments, a WD may be configured to transmit and/or receive information without direct human interaction. For instance, a WD may be designed to transmit information to a network on a predetermined schedule, when triggered by an internal or external event, or in response to requests from the network. Examples of a WD include, but are not limited to, a smart phone, a mobile phone, a cell phone, a voice over IP (VoIP) phone, a wireless local loop phone, a desktop computer, a personal digital assistant (PDA), a wireless cameras, a gaming console or device, a music storage device, a playback appliance, a wearable terminal device, a wireless endpoint, a mobile station, a tablet, a laptop, a laptop-embedded equipment (LEE), a laptop-mounted equipment (LME), a smart device, a wireless customer-premise equipment (CPE). a vehicle-mounted wireless terminal device, etc. A WD may support device-to-device (D2D) communication, for example by implementing a 3GPP standard for sidelink communication, vehicle-to-vehicle (V2V), vehicle-to-infrastructure (V2I), vehicle-to-everything (V2X) and may in this case be referred to as a D2D communication device.

As yet another specific example, in an Internet of Things (IoT) scenario, a WD may represent a machine or other device that performs monitoring and/or measurements and transmits the results of such monitoring and/or measurements to another WD and/or a network node. The WD may in this case be a machine-to-machine (M2M) device, which may in a 3GPP context be referred to as an MTC device. As one example, the WD may be a UE implementing the 3GPP narrow band internet of things (NB-IoT) standard. Examples of such machines or devices are sensors, metering devices such as power meters, industrial machinery, or home or personal appliances (e.g. refrigerators, televisions, etc.) personal wearables (e.g., watches, fitness trackers, etc.).

In other scenarios, a WD may represent a vehicle or other equipment that is capable of monitoring and/or reporting on its operational status or other functions associated with its operation. A WD as described above may represent the endpoint of a wireless connection, in which case the device may be referred to as a wireless terminal. Furthermore, a WD as described above may be mobile, in which case it may also be referred to as a mobile device or a mobile terminal.

As illustrated, wireless device 110 includes antenna 111, interface 114, processing circuitry 120, device readable medium 130, user interface equipment 132, auxiliary equipment 134, power source 136 and power circuitry 137. WD 110 may include multiple sets of one or more of the illustrated components for different wireless technologies supported by WD 110, such as, for example, GSM, WCDMA, LTE, NR, WiFi, WiMAX, or Bluetooth wireless technologies, just to mention a few. These wireless technologies may be integrated into the same or different chips or set of chips as other components within WD 110.

Antenna 111 may include one or more antennas or antenna arrays, configured to send and/or receive wireless signals, and is connected to interface 114. In certain alternative embodiments, antenna 111 may be separate from WD 110 and be connectable to WD 110 through an interface or port. Antenna 111, interface 114, and/or processing circuitry 120 may be configured to perform any receiving or transmitting operations described herein as being performed by a WD. Any information, data and/or signals may be received from a network node and/or another WD. In some embodiments, radio front end circuitry and/or antenna 111 may be considered an interface.

As illustrated, interface 114 comprises radio front end circuitry 112 and antenna 111. Radio front end circuitry 112 comprise one or more filters 118 and amplifiers 116. Radio front end circuitry 114 is connected to antenna 111 and processing circuitry 120 and is configured to condition signals communicated between antenna 111 and processing circuitry 120. Radio front end circuitry 112 may be coupled to or a part of antenna 111. In some embodiments, WD 110 may not include separate radio front end circuitry 112; rather, processing circuitry 120 may comprise radio front end circuitry and may be connected to antenna 111. Similarly, in some embodiments, some or all of RF transceiver circuitry 122 may be considered a part of interface 114.

Radio front end circuitry 112 may receive digital data that is to be sent out to other network nodes or WDs via a wireless connection. Radio front end circuitry 112 may convert the digital data into a radio signal having the appropriate channel and bandwidth parameters using a combination of filters 118 and/or amplifiers 116. The radio signal may then be transmitted via antenna 111. Similarly, when receiving data, antenna 111 may collect radio signals which are then converted into digital data by radio front end circuitry 112. The digital data may be passed to processing circuitry 120. In other embodiments, the interface may comprise different components and/or different combinations of components.

Processing circuitry 120 may comprise a combination of one or more of a microprocessor, controller, microcontroller, central processing unit, digital signal processor, application-specific integrated circuit, field programmable gate array, or any other suitable computing device, resource, or combination of hardware, software, and/or encoded logic operable to provide, either alone or in conjunction with other WD 110 components, such as device readable medium 130, WD 110 functionality. Such functionality may include providing any of the various wireless features or benefits discussed herein. For example, processing circuitry 120 may execute instructions stored in device readable medium 130 or in memory within processing circuitry 120 to provide the functionality disclosed herein.

As illustrated, processing circuitry 120 includes one or more of RF transceiver circuitry 122, baseband processing circuitry 124, and application processing circuitry 126. In other embodiments, the processing circuitry may comprise different components and/or different combinations of components. In certain embodiments processing circuitry 120 of WD 110 may comprise a SOC. In some embodiments, RF transceiver circuitry 122, baseband processing circuitry 124, and application processing circuitry 126 may be on separate chips or sets of chips.

In alternative embodiments, part or all of baseband processing circuitry 124 and application processing circuitry 126 may be combined into one chip or set of chips, and RF transceiver circuitry 122 may be on a separate chip or set of chips. In still alternative embodiments, part or all of RF transceiver circuitry 122 and baseband processing circuitry 124 may be on the same chip or set of chips, and application processing circuitry 126 may be on a separate chip or set of chips. In yet other alternative embodiments, part or all of RF transceiver circuitry 122, baseband processing circuitry 124, and application processing circuitry 126 may be combined in the same chip or set of chips. In some embodiments, RF transceiver circuitry 122 may be a part of interface 114. RF transceiver circuitry 122 may condition RF signals for processing circuitry 120.

In certain embodiments, some or all of the functionality described herein as being performed by a WD may be provided by processing circuitry 120 executing instructions stored on device readable medium 130, which in certain embodiments may be a computer-readable storage medium. In alternative embodiments, some or all of the functionality may be provided by processing circuitry 120 without executing instructions stored on a separate or discrete device readable storage medium, such as in a hard-wired manner.

In any of those embodiments, whether executing instructions stored on a device readable storage medium or not, processing circuitry 120 can be configured to perform the described functionality. The benefits provided by such functionality are not limited to processing circuitry 120 alone or to other components of WD 110, but are enjoyed by WD 110, and/or by end users and the wireless network generally.

Processing circuitry 120 may be configured to perform any determining, calculating, or similar operations (e.g., certain obtaining operations) described herein as being performed by a WD. These operations, as performed by processing circuitry 120, may include processing information obtained by processing circuitry 120 by, for example, converting the obtained information into other information, comparing the obtained information or converted information to information stored by WD 110, and/or performing one or more operations based on the obtained information or converted information, and as a result of said processing making a determination.

Device readable medium 130 may be operable to store a computer program, software, an application including one or more of logic, rules, code, tables, etc. and/or other instructions capable of being executed by processing circuitry 120. Device readable medium 130 may include computer memory (e.g., Random Access Memory (RAM) or Read Only Memory (ROM)), mass storage media (e.g., a hard disk), removable storage media (e.g., a Compact Disk (CD) or a Digital Video Disk (DVD)), and/or any other volatile or non-volatile, non-transitory device readable and/or computer executable memory devices that store information, data, and/or instructions that may be used by processing circuitry 120. In some embodiments, processing circuitry 120 and device readable medium 130 may be integrated.

User interface equipment 132 may provide components that allow for a human user to interact with WD 110. Such interaction may be of many forms, such as visual, audial, tactile, etc. User interface equipment 132 may be operable to produce output to the user and to allow the user to provide input to WD 110. The type of interaction may vary depending on the type of user interface equipment 132 installed in WD 110. For example, if WD 110 is a smart phone, the interaction may be via a touch screen; if WD 110 is a smart meter, the interaction may be through a screen that provides usage (e.g., the number of gallons used) or a speaker that provides an audible alert (e.g., if smoke is detected).

User interface equipment 132 may include input interfaces, devices and circuits, and output interfaces, devices and circuits. User interface equipment 132 is configured to allow input of information into WD 110 and is connected to processing circuitry 120 to allow processing circuitry 120 to process the input information. User interface equipment 132 may include, for example, a microphone, a proximity or other sensor, keys/buttons, a touch display, one or more cameras, a USB port, or other input circuitry. User interface equipment 132 is also configured to allow output of information from WD 110, and to allow processing circuitry 120 to output information from WD 110. User interface equipment 132 may include, for example, a speaker, a display, vibrating circuitry, a USB port, a headphone interface, or other output circuitry. Using one or more input and output interfaces, devices, and circuits, of user interface equipment 132, WD 110 may communicate with end users and/or the wireless network and allow them to benefit from the functionality described herein.

Auxiliary equipment 134 is operable to provide more specific functionality which may not be generally performed by WDs. This may comprise specialized sensors for doing measurements for various purposes, interfaces for additional types of communication such as wired communications etc. The inclusion and type of components of auxiliary equipment 134 may vary depending on the embodiment and/or scenario.

Power source 136 may, in some embodiments, be in the form of a battery or battery pack. Other types of power sources, such as an external power source (e.g., an electricity outlet), photovoltaic devices or power cells, may also be used. WD 110 may further comprise power circuitry 137 for delivering power from power source 136 to the various parts of WD 110 which need power from power source 136 to carry out any functionality described or indicated herein. Power circuitry 137 may in certain embodiments comprise power management circuitry.

Power circuitry 137 may additionally or alternatively be operable to receive power from an external power source; in which case WD 110 may be connectable to the external power source (such as an electricity outlet) via input circuitry or an interface such as an electrical power cable. Power circuitry 137 may also in certain embodiments be operable to deliver power from an external power source to power source 136. This may be, for example, for the charging of power source 136. Power circuitry 137 may perform any formatting, converting, or other modification to the power from power source 136 to make the power suitable for the respective components of WD 110 to which power is supplied.

Although the subject matter described herein may be implemented in any appropriate type of system using any suitable components, the embodiments disclosed herein are described in relation to a wireless network, such as the example wireless network illustrated in FIG. 23. For simplicity, the wireless network of FIG. 23 only depicts network 106, network nodes 160 and 160*b*, and WDs 110, 110*b*, and 110*c*. In practice, a wireless network may further include any additional elements suitable to support communication between wireless devices or between a wireless device and another communication device, such as a landline telephone, a service provider, or any other network node or end device.

Of the illustrated components, network node 160 and wireless device (WD) 110 are depicted with additional detail. The wireless network may provide communication and other types of services to one or more wireless devices to facilitate the wireless devices' access to and/or use of the services provided by, or via, the wireless network.

Figure 24:
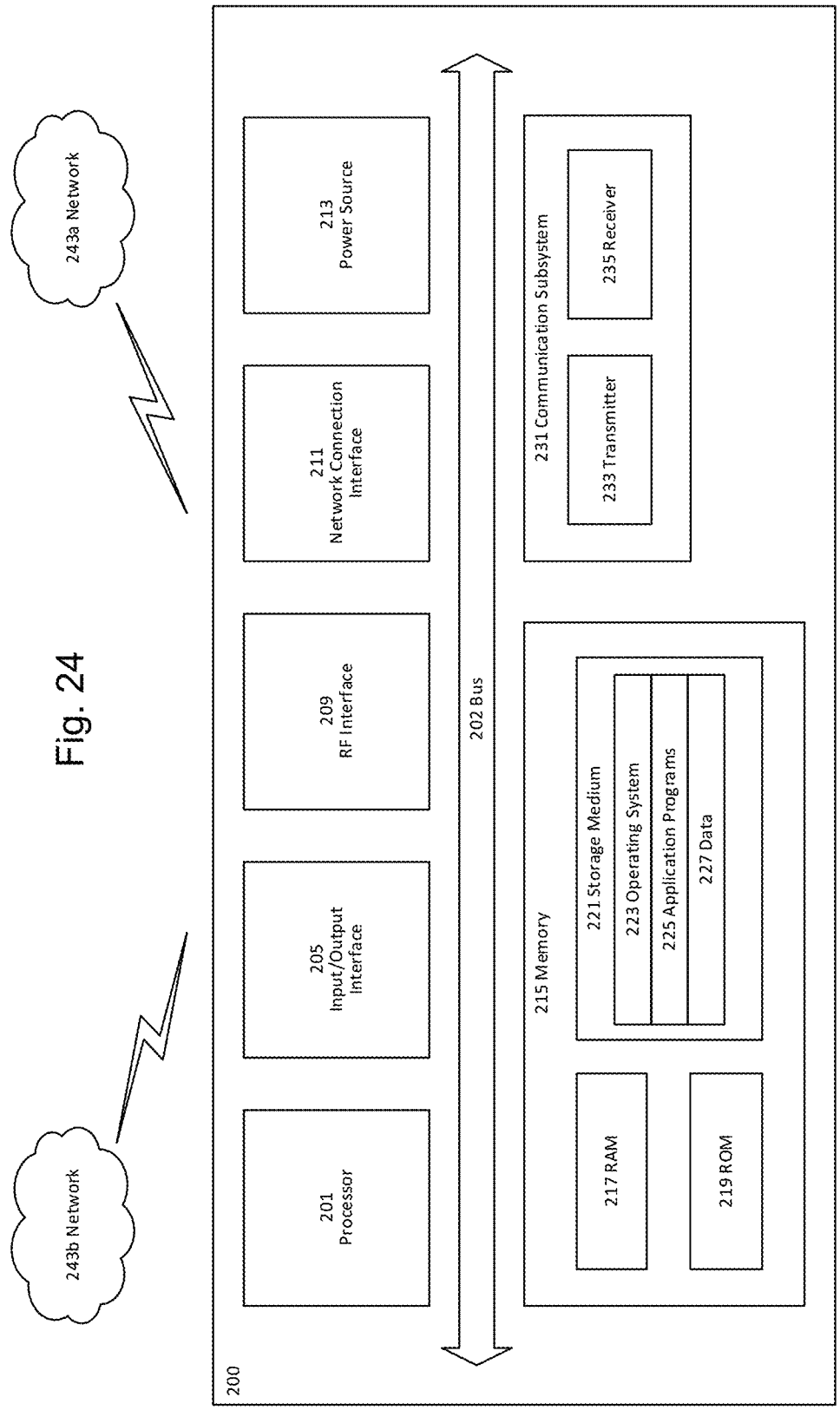
FIG. 24 illustrates an example user equipment, according to certain embodiments.

FIG. 24 illustrates an example user equipment, according to certain embodiments. As used herein, a user equipment or UE may not necessarily have a user in the sense of a human user who owns and/or operates the relevant device. Instead, a UE may represent a device that is intended for sale to, or operation by, a human user but which may not, or which may not initially, be associated with a specific human user (e.g., a smart sprinkler controller). Alternatively, a UE may represent a device that is not intended for sale to, or operation by, an end user but which may be associated with or operated for the benefit of a user (e.g., a smart power meter). UE 200 may be any UE identified by the 3rd Generation Partnership Project (3GPP), including a NB-IoT UE, a machine type communication (MTC) UE, and/or an enhanced MTC (eMTC) UE. UE 200, as illustrated in FIG. 24, is one example of a WD configured for communication in accordance with one or more communication standards promulgated by the 3rd Generation Partnership Project (3GPP), such as 3GPP's GSM, UMTS, LTE, and/or 5G standards. As mentioned previously, the term WD and UE may be used interchangeable. Accordingly, although FIG. 24 is a UE, the components discussed herein are equally applicable to a WD, and vice-versa.

In FIG. 24, UE 200 includes processing circuitry 201 that is operatively coupled to input/output interface 205, radio frequency (RF) interface 209, network connection interface 211, memory 215 including random access memory (RAM) 217, read-only memory (ROM) 219, and storage medium 221 or the like, communication subsystem 231, power source 233, and/or any other component, or any combination thereof. Storage medium 221 includes operating system 223, application program 225, and data 227. In other embodiments, storage medium 221 may include other similar types of information. Certain UEs may use all the components shown in FIG. 24, or only a subset of the components. The level of integration between the components may vary from one UE to another UE. Further, certain UEs may contain multiple instances of a component, such as multiple processors, memories, transceivers, transmitters, receivers, etc.

In FIG. 24, processing circuitry 201 may be configured to process computer instructions and data. Processing circuitry 201 may be configured to implement any sequential state machine operative to execute machine instructions stored as machine-readable computer programs in the memory, such as one or more hardware-implemented state machines (e.g., in discrete logic, FPGA, ASIC, etc.); programmable logic together with appropriate firmware; one or more stored program, general-purpose processors, such as a microprocessor or Digital Signal Processor (DSP), together with appropriate software; or any combination of the above. For example, the processing circuitry 201 may include two central processing units (CPUs). Data may be information in a form suitable for use by a computer.

In the depicted embodiment, input/output interface 205 may be configured to provide a communication interface to an input device, output device, or input and output device. UE 200 may be configured to use an output device via input/output interface 205.

An output device may use the same type of interface port as an input device. For example, a USB port may be used to provide input to and output from UE 200. The output device may be a speaker, a sound card, a video card, a display, a monitor, a printer, an actuator, an emitter, a smartcard, another output device, or any combination thereof.

UE 200 may be configured to use an input device via input/output interface 205 to allow a user to capture information into UE 200. The input device may include a touch-sensitive or presence-sensitive display, a camera (e.g., a digital camera, a digital video camera, a web camera, etc.), a microphone, a sensor, a mouse, a trackball, a directional pad, a trackpad, a scroll wheel, a smartcard, and the like. The presence-sensitive display may include a capacitive or resistive touch sensor to sense input from a user. A sensor may be, for instance, an accelerometer, a gyroscope, a tilt sensor, a force sensor, a magnetometer, an optical sensor, a proximity sensor, another like sensor, or any combination thereof. For example, the input device may be an accelerometer, a magnetometer, a digital camera, a microphone, and an optical sensor.

In FIG. 24, RF interface 209 may be configured to provide a communication interface to RF components such as a transmitter, a receiver, and an antenna. Network connection interface 211 may be configured to provide a communication interface to network 243a. Network 243a may encompass wired and/or wireless networks such as a local-area network (LAN), a wide-area network (WAN), a computer network, a wireless network, a telecommunications network, another like network or any combination thereof. For example, network 243a may comprise a Wi-Fi network. Network connection interface 211 may be configured to include a receiver and a transmitter interface used to communicate with one or more other devices over a communication network according to one or more communication protocols, such as Ethernet, TCP/IP, SONET, ATM, or the like. Network connection interface 211 may implement receiver and transmitter functionality appropriate to the communication network links (e.g., optical, electrical, and the like). The transmitter and receiver functions may share circuit components, software or firmware, or alternatively may be implemented separately.

RAM 217 may be configured to interface via bus 202 to processing circuitry 201 to provide storage or caching of data or computer instructions during the execution of software programs such as the operating system, application programs, and device drivers. ROM 219 may be configured to provide computer instructions or data to processing circuitry 201. For example, ROM 219 may be configured to store invariant low-level system code or data for basic system functions such as basic input and output (I/O), startup, or reception of keystrokes from a keyboard that are stored in a non-volatile memory.

Storage medium 221 may be configured to include memory such as RAM, ROM, programmable read-only memory (PROM), erasable programmable read-only memory (EPROM), electrically erasable programmable read-only memory (EEPROM), magnetic disks, optical disks, floppy disks, hard disks, removable cartridges, or flash drives. In one example, storage medium 221 may be configured to include operating system 223, application program 225 such as a web browser application, a widget or gadget engine or another application, and data file 227. Storage medium 221 may store, for use by UE 200, any of a variety of various operating systems or combinations of operating systems.

Storage medium 221 may be configured to include a number of physical drive units, such as redundant array of independent disks (RAID), floppy disk drive, flash memory, USB flash drive, external hard disk drive, thumb drive, pen drive, key drive, high-density digital versatile disc (HD-DVD) optical disc drive, internal hard disk drive, Blu-Ray optical disc drive, holographic digital data storage (HDDS) optical disc drive, external mini-dual in-line memory module (DIMM), synchronous dynamic random access memory (SDRAM), external micro-DIMM SDRAM, smartcard memory such as a subscriber identity module or a removable user identity (SIM/RUIM) module, other memory, or any combination thereof. Storage medium 221 may allow UE 200 to access computer-executable instructions, application programs or the like, stored on transitory or non-transitory memory media, to off-load data, or to upload data. An article of manufacture, such as one utilizing a communication system may be tangibly embodied in storage medium 221, which may comprise a device readable medium.

In FIG. 24, processing circuitry 201 may be configured to communicate with network 243b using communication subsystem 231. Network 243a and network 243b may be the same network or networks or different network or networks. Communication subsystem 231 may be configured to include one or more transceivers used to communicate with network 243b. For example, communication subsystem 231 may be configured to include one or more transceivers used to communicate with one or more remote transceivers of another device capable of wireless communication such as another WD, UE, or base station of a radio access network (RAN) according to one or more communication protocols, such as IEEE 802.2, CDMA, WCDMA, GSM, LTE, UTRAN, WiMax, or the like. Each transceiver may include transmitter 233 and/or receiver 235 to implement transmitter or receiver functionality, respectively, appropriate to the RAN links (e.g., frequency allocations and the like). Further, transmitter 233 and receiver 235 of each transceiver may share circuit components, software or firmware, or alternatively may be implemented separately.

In the illustrated embodiment, the communication functions of communication subsystem 231 may include data communication, voice communication, multimedia communication, short-range communications such as Bluetooth, near-field communication, location-based communication such as the use of the global positioning system (GPS) to determine a location, another like communication function, or any combination thereof. For example, communication subsystem 231 may include cellular communication, Wi-Fi communication, Bluetooth communication, and GPS communication. Network 243b may encompass wired and/or wireless networks such as a local-area network (LAN), a wide-area network (WAN), a computer network, a wireless network, a telecommunications network, another like network or any combination thereof. For example, network 243b may be a cellular network, a Wi-Fi network, and/or a near-field network. Power source 213 may be configured to provide alternating current (AC) or direct current (DC) power to components of UE 200.

The features, benefits and/or functions described herein may be implemented in one of the components of UE 200 or partitioned across multiple components of UE 200. Further, the features, benefits, and/or functions described herein may be implemented in any combination of hardware, software or firmware. In one example, communication subsystem 231 may be configured to include any of the components described herein. Further, processing circuitry 201 may be configured to communicate with any of such components over bus 202. In another example, any of such components may be represented by program instructions stored in memory that when executed by processing circuitry 201 perform the corresponding functions described herein. In another example, the functionality of any of such components may be partitioned between processing circuitry 201 and communication subsystem 231. In another example, the non-computationally intensive functions of any of such components may be implemented in software or firmware and the computationally intensive functions may be implemented in hardware.

Figure 25:
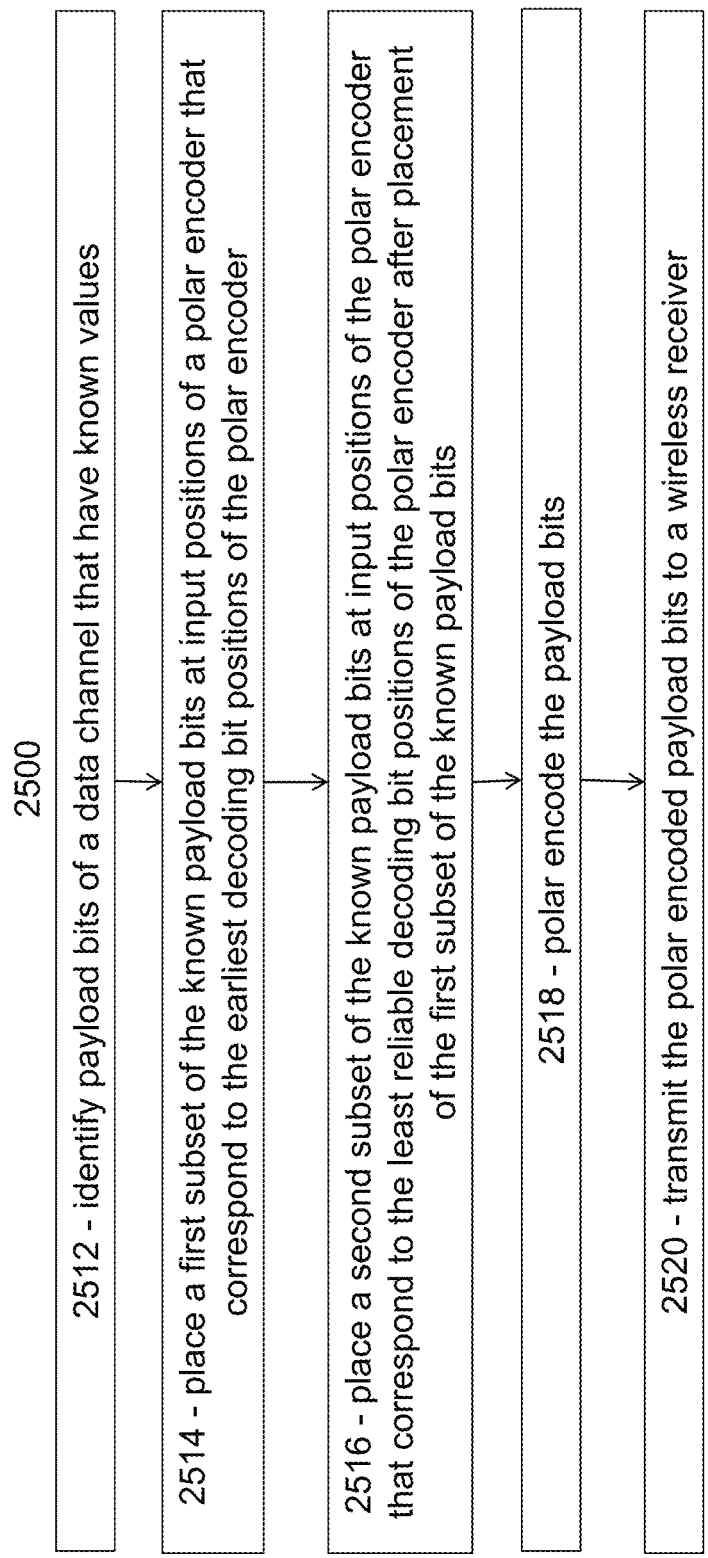
FIG. 25 illustrates a flowchart of an example method in a wireless transmitter for polar encoding payload bits, according to certain embodiments.

FIG. 25 illustrates a flowchart of an example method in a wireless transmitter for polar encoding payload bits, according to certain embodiments. In particular embodiments, one or more steps of FIG. 25 may be performed by or network node 160 described with respect to FIG. 23.

The method begins at step 2512, where the wireless transmitter (e.g., network node 160) identifies payload bits of a data channel that have known values. As used herein, a known value refers to a value that a wireless receiver either knows or can determine (i.e., partially known) without decoding the received payload bit. For example, the known value may be a predetermined constant (e.g., 0 for reserved fields) or may be determinable based on other information (e.g., an incrementing SFN, a SS time index, etc.).

At step 2514, the wireless transmitter places a first subset of the known payload bits at input positions of a polar encoder that correspond to the earliest decoding bit positions of the polar encoder. For example, a first performance criterion may comprise early termination gain, and the wireless transmitter may place the first subset of the known payload bits in bit positions that are decoded earliest to improve early termination gain.

As a specific example, the identified payload bits that have known values include a HFI bit, one or more SS block time index bits, and SFN bits. The first subset of the known payload bits may include HFI bit and SS block time index bits. Other examples include any of the embodiments described with respect to FIGS. 6-22.

At step 2516, the wireless transmitter places a second subset of the known payload bits at input positions of a polar encoder that correspond to the least reliable decoding bit positions of the polar encoder after placement of the first subset of the known payload bits. For example, a second performance criterion may comprise enhanced error performance, and the wireless transmitter may place the second subset of the known payload bits in least reliable bit positions of the polar encoder to enhance error performance.

As a specific example, the identified payload bits that have known values include a HFI bit, one or more SS block time index bits, and SFN bits. The second subset of the known payload bits may include SFN bits. Other examples include any of the embodiments described with respect to FIGS. 6-22.

At step 2518, the wireless transmitter polar encodes the payload bits. For example, with respect to FIG. 5, polar encoder 14 may polar encode the payload bits from CRC encoder 10 and interleaver 12. Known bit interleaver 16 placed the known bits at the proper inputs to CRC encoder 10 so that after encoding and interleaving, the known bits are at the desired inputs of polar encoder 14.

At step 2520, the wireless transmitter transmits the polar encoded payload bits to a wireless receiver. The wireless receiver may decode the payload bits according to method 2600 described with respect to FIG. 26.

Modifications, additions, or omissions may be made to method 2500 of FIG. 25. Additionally, one or more steps in the method of FIG. 25 may be performed in parallel or in any suitable order.

Figure 26:
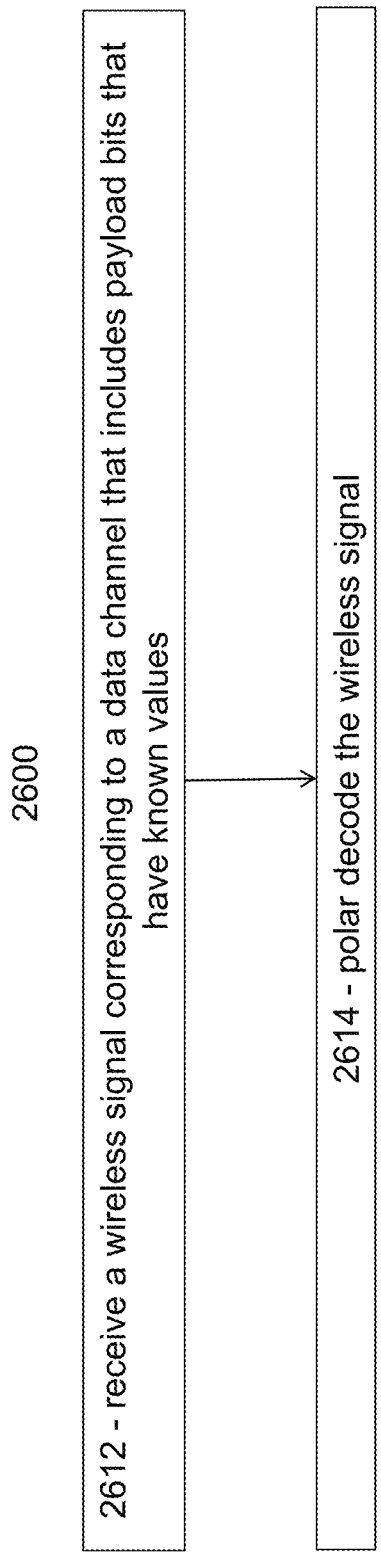
FIG. 26 illustrates a flowchart of an example method in a wireless receiver for polar decoding payload bits, according to certain embodiments.

FIG. 26 illustrates a flowchart of an example method in a wireless receiver for receiving polar encoded payload bits, according to certain embodiments. In particular embodiments, one or more steps of FIG. 26 may be performed by wireless device 110 described with respect to FIG. 23.

The method begins at step 2612, where the wireless receiver (e.g., wireless device 110) receives a wireless signal corresponding to a data channel that includes payload bits that have known values. The known payload bits include a first subset of the known payload bits that are polar decoded earliest of the payload bits in the data channel and a second subset of the known payload bits that are polar decoded with least reliability of the payload bits in the data channel after polar decoding of the first subset of payload bits. For example, the payload bits may have been encoded according to steps 2512-2518 described with respect to FIG. 25.

At step 2614, the wireless receiver decodes the wireless signal. The wireless receiver benefits from the known bit positions. For example, known bits may be positioned so that the wireless device can determine early in the decoding process whether the decoding is successful. Minimizing the decoding latency may be accomplished by maximizing the early decoding termination rate to reduce latency and energy consumption. As another example, known bits may be positioned to minimize the block error rate. Known bits may be positioned in the least reliable positions among the set of positions available.

Modifications, additions, or omissions may be made to method 2600 of FIG. 26. Additionally, one or more steps in the method of FIG. 26 may be performed in parallel or in any suitable order.

Figure 27:
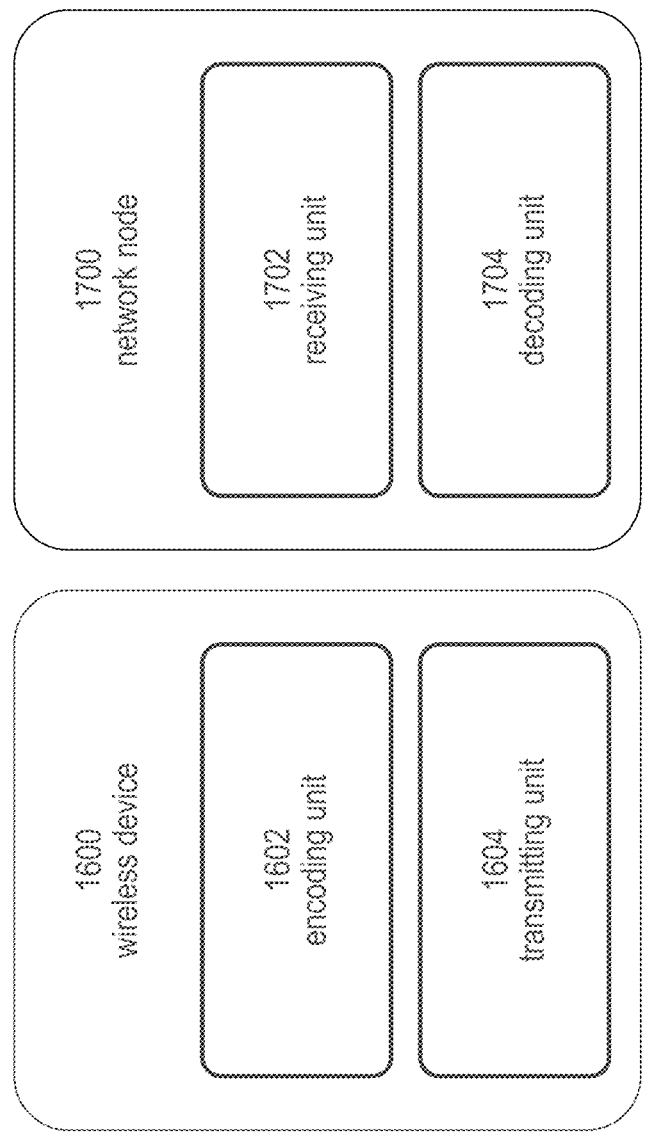
FIG. 27 illustrates a schematic block diagram of two apparatuses in a wireless network, according to certain embodiments.

FIG. 27 illustrates a schematic block diagram of two apparatuses in a wireless network (for example, the wireless network illustrated in FIG. 23). The apparatuses include a wireless device and a network node (e.g., wireless device 110 or network node 160 illustrated in FIG. 23). Apparatuses 1600 and 1700 are operable to carry out the example methods described with reference to FIGS. 25 and 26, respectively, and possibly any other processes or methods disclosed herein. It is also to be understood that the method of FIGS. 25 and 26 are not necessarily carried out solely by apparatus 1600 and/or apparatus 1700. At least some operations of the method can be performed by one or more other entities.

Virtual apparatuses 1600 and 1700 may comprise processing circuitry, which may include one or more microprocessor or microcontrollers, as well as other digital hardware, which may include digital signal processors (DSPs), special-purpose digital logic, and the like. The processing circuitry may be configured to execute program code stored in memory, which may include one or several types of memory such as read-only memory (ROM), random-access memory, cache memory, flash memory devices, optical storage devices, etc. Program code stored in memory includes program instructions for executing one or more telecommunications and/or data communications protocols as well as instructions for carrying out one or more of the techniques described herein, in several embodiments.

In some implementations, the processing circuitry may be used to cause encoding unit 1602, transmitting unit 1604, and any other suitable units of apparatus 1600 to perform corresponding functions according one or more embodiments of the present disclosure. Similarly, the processing circuitry described above may be used to cause receiving unit 1702, decoding unit 1704, and any other suitable units of apparatus 1700 to perform corresponding functions according one or more embodiments of the present disclosure As illustrated in FIG. 27, apparatus 1600 includes encoding unit 1602 configured to: identify payload bits of a data channel that have known values; place a first subset of the known payload bits at input positions of a polar encoder to optimize a first performance criterion; place a second subset of the known payload bits at input positions of the polar encoder to optimize a second performance criterion; and polar encode the payload bits. Apparatus 1600 also includes transmitting unit 1604 configured to transmit polar encoded payload bits to a wireless receiver.

As illustrated in FIG. 27, apparatus 1700 includes receiving unit 1702 configured to receive a wireless signal corresponding to a data channel that includes payload bits that have known values. Apparatus 1700 also includes decoding unit 1704 configured to polar decode a wireless signal.

Figure 28:
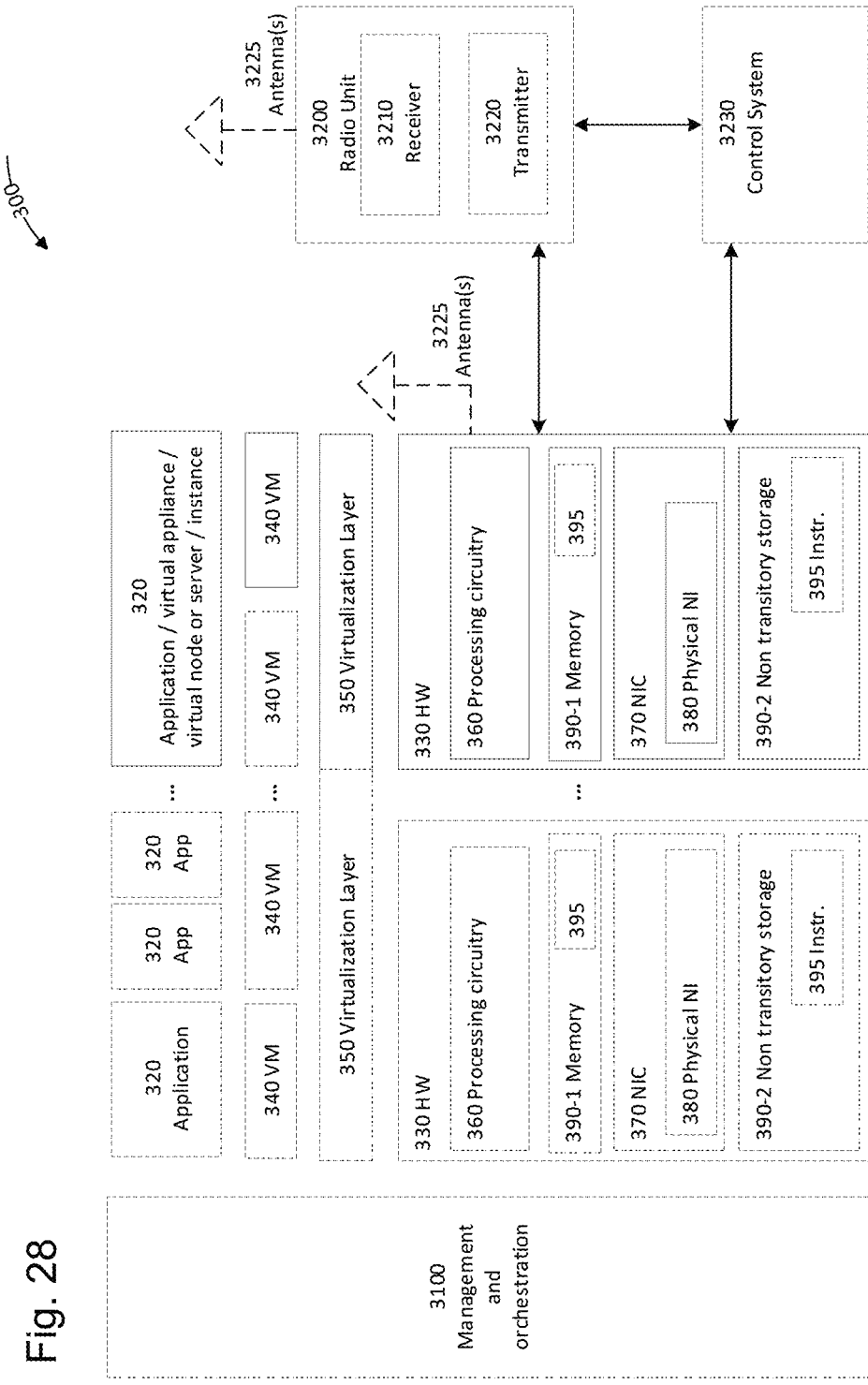
FIG. 28 illustrates an example virtualization environment, according to certain embodiments.

FIG. 28 is a schematic block diagram illustrating a virtualization environment 300 in which functions implemented by some embodiments may be virtualized. In the present context, virtualizing means creating virtual versions of apparatuses or devices which may include virtualizing hardware platforms, storage devices and networking resources. As used herein, virtualization can be applied to a node (e.g., a virtualized base station or a virtualized radio access node) or to a device (e.g., a UE, a wireless device or any other type of communication device) or components thereof and relates to an implementation in which at least a portion of the functionality is implemented as one or more virtual components (e.g., via one or more applications, components, functions, virtual machines or containers executing on one or more physical processing nodes in one or more networks).

In some embodiments, some or all of the functions described herein may be implemented as virtual components executed by one or more virtual machines implemented in one or more virtual environments 300 hosted by one or more of hardware nodes 330. Further, in embodiments in which the virtual node is not a radio access node or does not require radio connectivity (e.g., a core network node), then the network node may be entirely virtualized.

The functions may be implemented by one or more applications 320 (which may alternatively be called software instances, virtual appliances, network functions, virtual nodes, virtual network functions, etc.) operative to implement some of the features, functions, and/or benefits of some of the embodiments disclosed herein. Applications 320 are run in virtualization environment 300 which provides hardware 330 comprising processing circuitry 360 and memory 390. Memory 390 contains instructions 395 executable by processing circuitry 360 whereby application 320 is operative to provide one or more of the features, benefits, and/or functions disclosed herein.

Virtualization environment 300, comprises general-purpose or special-purpose network hardware devices 330 comprising a set of one or more processors or processing circuitry 360, which may be commercial off-the-shelf (COTS) processors, dedicated Application Specific Integrated Circuits (ASICs), or any other type of processing circuitry including digital or analog hardware components or special purpose processors. Each hardware device may comprise memory 390-1 which may be non-persistent memory for temporarily storing instructions 395 or software executed by processing circuitry 360. Each hardware device may comprise one or more network interface controllers (NICs) 370, also known as network interface cards, which include physical network interface 380. Each hardware device may also include non-transitory, persistent, machine-readable storage media 390-2 having stored therein software 395 and/or instructions executable by processing circuitry 360. Software 395 may include any type of software including software for instantiating one or more virtualization layers 350 (also referred to as hypervisors), software to execute virtual machines 340 as well as software allowing it to execute functions, features and/or benefits described in relation with some embodiments described herein.

Virtual machines 340, comprise virtual processing, virtual memory, virtual networking or interface and virtual storage, and may be run by a corresponding virtualization layer 350 or hypervisor. Different embodiments of the instance of virtual appliance 320 may be implemented on one or more of virtual machines 340, and the implementations may be made in different ways.

During operation, processing circuitry 360 executes software 395 to instantiate the hypervisor or virtualization layer 350, which may sometimes be referred to as a virtual machine monitor (VMM). Virtualization layer 350 may present a virtual operating platform that appears like networking hardware to virtual machine 340. As shown in FIG. 28, hardware 330 may be a standalone network node with generic or specific components. Hardware 330 may comprise antenna 3225 and may implement some functions via virtualization. Alternatively, hardware 330 may be part of a larger cluster of hardware (e.g. such as in a data center or customer premise equipment (CPE)) where many hardware nodes work together and are managed via management and orchestration (MANO) 3100, which, among others, oversees lifecycle management of applications 320.

Virtualization of the hardware is in some contexts referred to as network function virtualization (NFV). NFV may be used to consolidate many network equipment types onto industry standard high-volume server hardware, physical switches, and physical storage, which can be located in data centers, and customer premise equipment.

In the context of NFV, virtual machine 340 may be a software implementation of a physical machine that runs programs as if they were executing on a physical, non-virtualized machine. Each of virtual machines 340, and that part of hardware 330 that executes that virtual machine, be it hardware dedicated to that virtual machine and/or hardware shared by that virtual machine with others of the virtual machines 340, forms a separate virtual network elements (VNE).

Still in the context of NFV, Virtual Network Function (VNF) is responsible for handling specific network functions that run in one or more virtual machines 340 on top of hardware networking infrastructure 330 and corresponds to application 320 in FIG. 18.

In some embodiments, one or more radio units 3200 that each include one or more transmitters 3220 and one or more receivers 3210 may be coupled to one or more antennas 3225. Radio units 3200 may communicate directly with hardware nodes 330 via one or more appropriate network interfaces and may be used in combination with the virtual components to provide a virtual node with radio capabilities, such as a radio access node or a base station.

In some embodiments, some signaling can be effected with the use of control system 3230 which may alternatively be used for communication between the hardware nodes 330 and radio units 3200.

Figure 29:
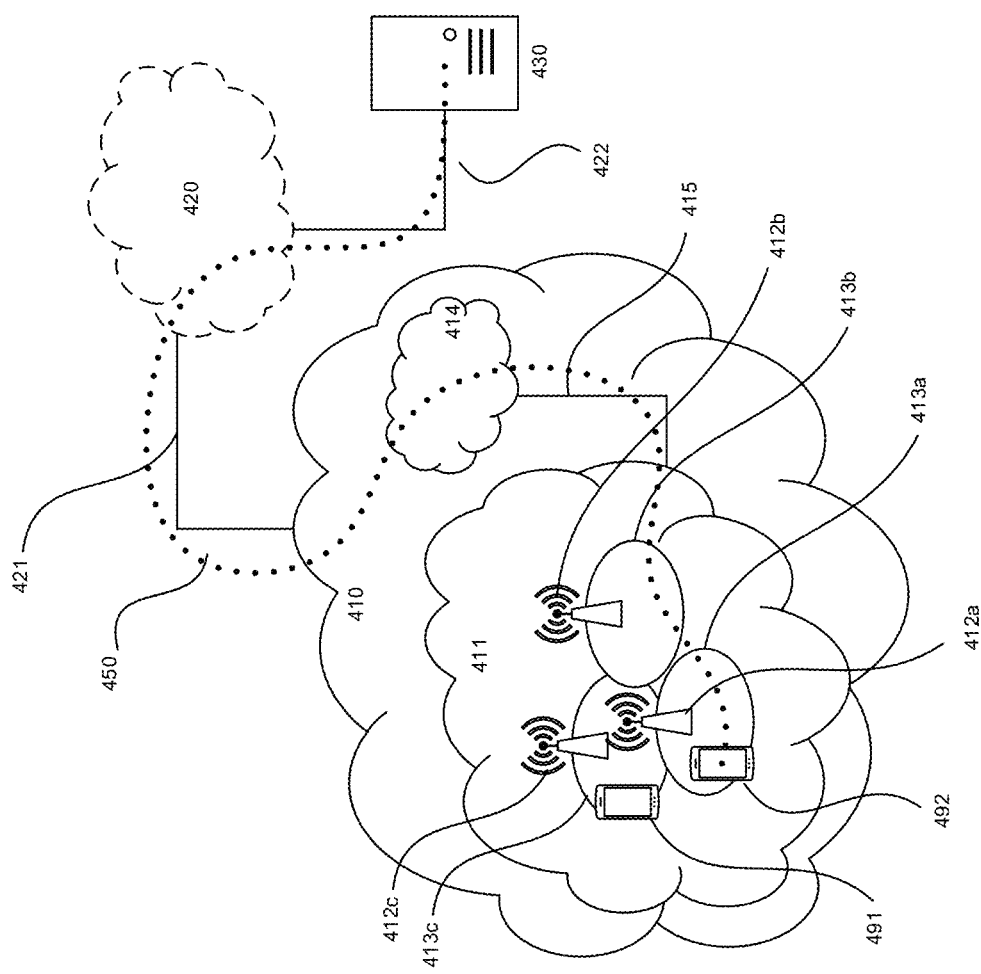
FIG. 29 illustrates an example telecommunication network connected via an intermediate network to a host computer, according to certain embodiments.

With reference to FIG. 29, in accordance with an embodiment, a communication system includes telecommunication network 410, such as a 3GPP-type cellular network, which comprises access network 411, such as a radio access network, and core network 414. Access network 411 comprises a plurality of base stations 412a, 412b, 412c, such as NBs, eNBs, gNBs or other types of wireless access points, each defining a corresponding coverage area 413a, 413b, 413c. Each base station 412a, 412b, 412c is connectable to core network 414 over a wired or wireless connection 415. A first UE 491 located in coverage area 413c is configured to wirelessly connect to, or be paged by, the corresponding base station 412c. A second UE 492 in coverage area 413a is wirelessly connectable to the corresponding base station 412a. While a plurality of UEs 491, 492 are illustrated in this example, the disclosed embodiments are equally applicable to a situation where a sole UE is in the coverage area or where a sole UE is connecting to the corresponding base station 412.

Telecommunication network 410 is itself connected to host computer 430, which may be embodied in the hardware and/or software of a standalone server, a cloud-implemented server, a distributed server or as processing resources in a server farm. Host computer 430 may be under the ownership or control of a service provider or may be operated by the service provider or on behalf of the service provider. Connections 421 and 422 between telecommunication network 410 and host computer 430 may extend directly from core network 414 to host computer 430 or may go via an optional intermediate network 420. Intermediate network 420 may be one of, or a combination of more than one of, a public, private or hosted network; intermediate network 420, if any, may be a backbone network or the Internet; in particular, intermediate network 420 may comprise two or more subnetworks (not shown).

The communication system of FIG. 29 as a whole enables connectivity between the connected UEs 491, 492 and host computer 430. The connectivity may be described as an over-the-top (OTT) connection 450. Host computer 430 and the connected UEs 491, 492 are configured to communicate data and/or signaling via OTT connection 450, using access network 411, core network 414, any intermediate network 420 and possible further infrastructure (not shown) as intermediaries. OTT connection 450 may be transparent in the sense that the participating communication devices through which OTT connection 450 passes are unaware of routing of uplink and downlink communications. For example, base station 412 may not or need not be informed about the past routing of an incoming downlink communication with data originating from host computer 430 to be forwarded (e.g., handed over) to a connected UE 491. Similarly, base station 412 need not be aware of the future routing of an outgoing uplink communication originating from the UE 491 towards the host computer 430.

Figure 30:
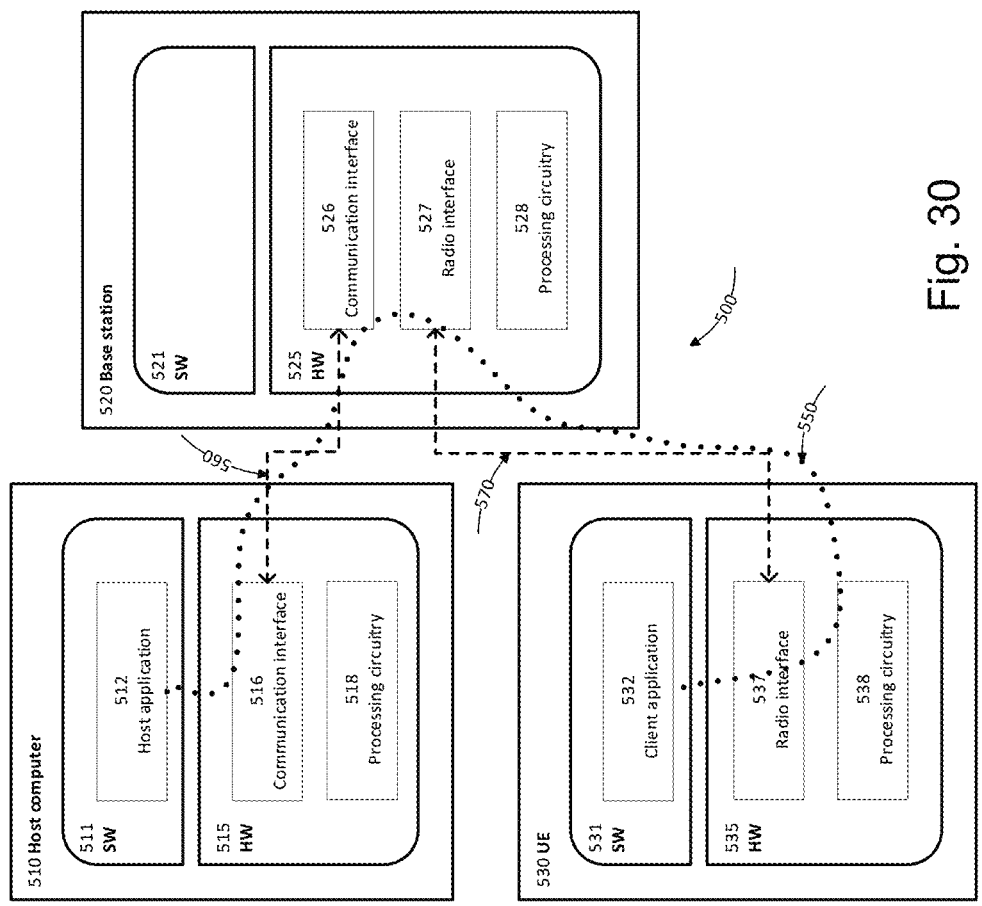
FIG. 30 illustrates an example host computer communicating via a base station with a user equipment over a partially wireless connection, according to certain embodiments.

FIG. 30 illustrates an example host computer communicating via a base station with a user equipment over a partially wireless connection, according to certain embodiments. Example implementations, in accordance with an embodiment of the UE, base station and host computer discussed in the preceding paragraphs will now be described with reference to FIG. 30. In communication system 500, host computer 510 comprises hardware 515 including communication interface 516 configured to set up and maintain a wired or wireless connection with an interface of a different communication device of communication system 500. Host computer 510 further comprises processing circuitry 518, which may have storage and/or processing capabilities. In particular, processing circuitry 518 may comprise one or more programmable processors, application-specific integrated circuits, field programmable gate arrays or combinations of these (not shown) adapted to execute instructions. Host computer 510 further comprises software 511, which is stored in or accessible by host computer 510 and executable by processing circuitry 518. Software 511 includes host application 512. Host application 512 may be operable to provide a service to a remote user, such as UE 530 connecting via OTT connection 550 terminating at UE 530 and host computer 510. In providing the service to the remote user, host application 512 may provide user data which is transmitted using OTT connection 550.

Communication system 500 further includes base station 520 provided in a telecommunication system and comprising hardware 525 enabling it to communicate with host computer 510 and with UE 530. Hardware 525 may include communication interface 526 for setting up and maintaining a wired or wireless connection with an interface of a different communication device of communication system 500, as well as radio interface 527 for setting up and maintaining at least wireless connection 570 with UE 530 located in a coverage area (not shown in FIG. 30) served by base station 520. Communication interface 526 may be configured to facilitate connection 560 to host computer 510. Connection 560 may be direct, or it may pass through a core network (not shown in FIG. 30) of the telecommunication system and/or through one or more intermediate networks outside the telecommunication system. In the embodiment shown, hardware 525 of base station 520 further includes processing circuitry 528, which may comprise one or more programmable processors, application-specific integrated circuits, field programmable gate arrays or combinations of these (not shown) adapted to execute instructions. Base station 520 further has software 521 stored internally or accessible via an external connection.

Communication system 500 further includes UE 530 already referred to. Its hardware 535 may include radio interface 537 configured to set up and maintain wireless connection 570 with a base station serving a coverage area in which UE 530 is currently located. Hardware 535 of UE 530 further includes processing circuitry 538, which may comprise one or more programmable processors, application-specific integrated circuits, field programmable gate arrays or combinations of these (not shown) adapted to execute instructions. UE 530 further comprises software 531, which is stored in or accessible by UE 530 and executable by processing circuitry 538. Software 531 includes client application 532. Client application 532 may be operable to provide a service to a human or non-human user via UE 530, with the support of host computer 510. In host computer 510, an executing host application 512 may communicate with the executing client application 532 via OTT connection 550 terminating at UE 530 and host computer 510. In providing the service to the user, client application 532 may receive request data from host application 512 and provide user data in response to the request data. OTT connection 550 may transfer both the request data and the user data. Client application 532 may interact with the user to generate the user data that it provides.

It is noted that host computer 510, base station 520 and UE 530 illustrated in FIG. 30 may be similar or identical to host computer 430, one of base stations 412a, 412b, 412c and one of UEs 491, 492 of FIG. 29, respectively. This is to say, the inner workings of these entities may be as shown in FIG. 27 and independently, the surrounding network topology may be that of FIG. 29.

In FIG. 30, OTT connection 550 has been drawn abstractly to illustrate the communication between host computer 510 and UE 530 via base station 520, without explicit reference to any intermediary devices and the precise routing of messages via these devices. Network infrastructure may determine the routing, which it may be configured to hide from UE 530 or from the service provider operating host computer 510, or both. While OTT connection 550 is active, the network infrastructure may further take decisions by which it dynamically changes the routing (e.g., based on load balancing consideration or reconfiguration of the network).

Wireless connection 570 between UE 530 and base station 520 is in accordance with the teachings of the embodiments described throughout this disclosure. One or more of the various embodiments improve the performance of OTT services provided to UE 530 using OTT connection 550, in which wireless connection 570 forms the last segment. More precisely, the teachings of these embodiments may improve the signaling overhead and reduce latency, which may provide faster internet access for users.

A measurement procedure may be provided for monitoring data rate, latency and other factors on which the one or more embodiments improve. There may further be an optional network functionality for reconfiguring OTT connection 550 between host computer 510 and UE 530, in response to variations in the measurement results. The measurement procedure and/or the network functionality for reconfiguring OTT connection 550 may be implemented in software 511 and hardware 515 of host computer 510 or in software 531 and hardware 535 of UE 530, or both. In embodiments, sensors (not shown) may be deployed in or in association with communication devices through which OTT connection 550 passes; the sensors may participate in the measurement procedure by supplying values of the monitored quantities exemplified above or supplying values of other physical quantities from which software 511, 531 may compute or estimate the monitored quantities. The reconfiguring of OTT connection 550 may include message format, retransmission settings, preferred routing etc.; the reconfiguring need not affect base station 520, and it may be unknown or imperceptible to base station 520. Such procedures and functionalities may be known and practiced in the art. In certain embodiments, measurements may involve proprietary UE signaling facilitating host computer 510's measurements of throughput, propagation times, latency and the like. The measurements may be implemented in that software 511 and 531 causes messages to be transmitted, in particular empty or 'dummy' messages, using OTT connection 550 while it monitors propagation times, errors etc.

Figure 31:
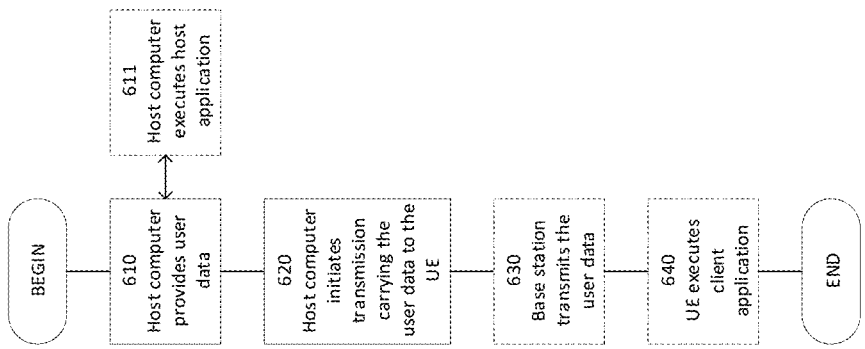
FIG. 31 is a flowchart illustrating a method implemented, according to certain embodiments.

FIG. 31 is a flowchart illustrating a method implemented in a communication system, in accordance with one embodiment. The communication system includes a host computer, a base station and a UE which may be those described with reference to FIGS. 29 and 30. For simplicity of the present disclosure, only drawing references to FIG. 31 will be included in this section.

In step 610, the host computer provides user data. In substep 611 (which may be optional) of step 610, the host computer provides the user data by executing a host application. In step 620, the host computer initiates a transmission carrying the user data to the UE. In step 630 (which may be optional), the base station transmits to the UE the user data which was carried in the transmission that the host computer initiated, in accordance with the teachings of the embodiments described throughout this disclosure. In step 640 (which may also be optional), the UE executes a client application associated with the host application executed by the host computer.

Figure 32:
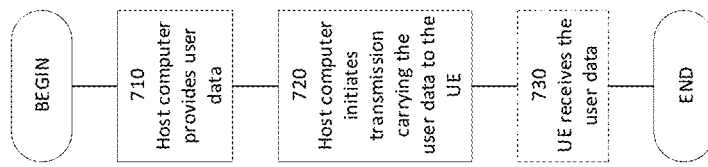
FIG. 32 is a flowchart illustrating a method implemented in a communication system, according to certain embodiments.

FIG. 32 is a flowchart illustrating a method implemented in a communication system, in accordance with one embodiment. The communication system includes a host computer, a base station and a UE which may be those described with reference to FIGS. 29 and 30. For simplicity of the present disclosure, only drawing references to FIG. 32 will be included in this section.

In step 710 of the method, the host computer provides user data. In an optional substep (not shown) the host computer provides the user data by executing a host application. In step 720, the host computer initiates a transmission carrying the user data to the UE. The transmission may pass via the base station, in accordance with the teachings of the embodiments described throughout this disclosure. In step 730 (which may be optional), the UE receives the user data carried in the transmission.

Figure 33:
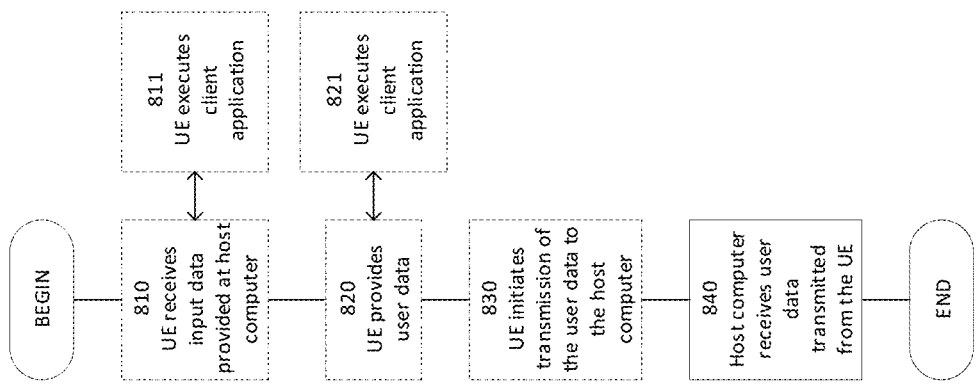
FIG. 33 is a flowchart illustrating a method implemented in a communication system, according to certain embodiments.

FIG. 33 is a flowchart illustrating a method implemented in a communication system, in accordance with one embodiment. The communication system includes a host computer, a base station and a UE which may be those described with reference to FIGS. 29 and 30. For simplicity of the present disclosure, only drawing references to FIG. 33 will be included in this section.

In step 810 (which may be optional), the UE receives input data provided by the host computer. Additionally, or alternatively, in step 820, the UE provides user data. In substep 821 (which may be optional) of step 820, the UE provides the user data by executing a client application. In substep 811 (which may be optional) of step 810, the UE executes a client application which provides the user data in reaction to the received input data provided by the host computer. In providing the user data, the executed client application may further consider user input received from the user. Regardless of the specific manner in which the user data was provided, the UE initiates, in substep 830 (which may be optional), transmission of the user data to the host computer. In step 840 of the method, the host computer receives the user data transmitted from the UE, in accordance with the teachings of the embodiments described throughout this disclosure.

Figure 34:
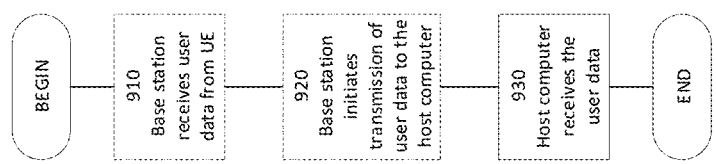
FIG. 34 is a flowchart illustrating a method implemented in a communication system, according to certain embodiments.

FIG. 34 is a flowchart illustrating a method implemented in a communication system, in accordance with one embodiment. The communication system includes a host computer, a base station and a UE which may be those described with reference to FIGS. 29 and 30. For simplicity of the present disclosure, only drawing references to FIG. 34 will be included in this section.

In step 910 (which may be optional), in accordance with the teachings of the embodiments described throughout this disclosure, the base station receives user data from the UE. In step 920 (which may be optional), the base station initiates transmission of the received user data to the host computer. In step 930 (which may be optional), the host computer receives the user data carried in the transmission initiated by the base station.

The term unit may have conventional meaning in the field of electronics, electrical devices and/or electronic devices and may include, for example, electrical and/or electronic circuitry, devices, modules, processors, memories, logic solid state and/or discrete devices, computer programs or instructions for carrying out respective tasks, procedures, computations, outputs, and/or displaying functions, and so on, as such as those that are described herein.

Generally, all terms used herein are to be interpreted according to their ordinary meaning in the relevant technical field, unless a different meaning is clearly given and/or is implied from the context in which it is used. All references to a/an/the element, apparatus, component, means, step, etc. are to be interpreted openly as referring to at least one instance of the element, apparatus, component, means, step, etc., unless explicitly stated otherwise. The steps of any methods disclosed herein do not have to be performed in the exact order disclosed, unless a step is explicitly described as following or preceding another step and/or where it is implicit that a step must follow or precede another step. Any feature of any of the embodiments disclosed herein may be applied to any other embodiment, wherever appropriate. Likewise, any advantage of any of the embodiments may apply to any other embodiments, and vice versa. Other objectives, features and advantages of the enclosed embodiments will be apparent from the following description.

Modifications, additions, or omissions may be made to the systems and apparatuses disclosed herein without departing from the scope of the invention. The components of the systems and apparatuses may be integrated or separated. Moreover, the operations of the systems and apparatuses may be performed by more, fewer, or other components. Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods disclosed herein without departing from the scope of the invention. The methods may include more, fewer, or other steps. Additionally, steps may be performed in any suitable order.

The foregoing description sets forth numerous specific details. It is understood, however, that embodiments may be practiced without these specific details. In other instances, well-known circuits, structures and techniques have not been shown in detail in order not to obscure the understanding of this description. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments, whether or not explicitly described.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the claims below.

At least some of the following abbreviations may be used in this disclosure. If there is an inconsistency between abbreviations, preference should be given to how it is used above. If listed multiple times below, the first listing should be preferred over any subsequent listing(s).

1×RTT CDMA2000 1× Radio Transmission Technology
3GPP 3rd Generation Partnership Project
5G 5th Generation
ABS Almost Blank Subframe
ARQ Automatic Repeat Request
AWGN Additive White Gaussian Noise
BCCH Broadcast Control Channel
BCH Broadcast Channel
CA Carrier Aggregation
CC Carrier Component
CCCH SDU Common Control Channel SDU
CDMA Code Division Multiplexing Access
CGI Cell Global Identifier
CIR Channel Impulse Response
CP Cyclic Prefix
CPICH Common Pilot Channel
CPICH Ec/No CPICH Received energy per chip divided by the power density in the band
CQI Channel Quality information
C-RNTI Cell RNTI
CSI Channel State Information
DCCH Dedicated Control Channel
DL Downlink
DM Demodulation
DMRS Demodulation Reference Signal
DRX Discontinuous Reception
DTX Discontinuous Transmission
DTCH Dedicated Traffic Channel
DUT Device Under Test
E-CID Enhanced Cell-ID (positioning method)
E-SMLC Evolved-Serving Mobile Location Centre
ECGI Evolved CGI
eNB E-UTRAN NodeB
ePDCCH enhanced Physical Downlink Control Channel
E-SMLC evolved Serving Mobile Location Center
E-UTRA Evolved UTRA
E-UTRAN Evolved UTRAN
FDD Frequency Division Duplex
GERAN GSM EDGE Radio Access Network
gNB Base station in NR
GNSS Global Navigation Satellite System
GSM Global System for Mobile communication
HARQ Hybrid Automatic Repeat Request
HO Handover
HSPA High Speed Packet Access
HRPD High Rate Packet Data
IR-HARQ Incremental Redundancy HARQ
LLR Log Likelihood Ratio
LOS Line of Sight
LPP LTE Positioning Protocol
LTE Long-Term Evolution
MAC Medium Access Control
MBMS Multimedia Broadcast Multicast Services
MBSFN Multimedia Broadcast multicast service Single Frequency Network
MBSFN ABS MBSFN Almost Blank Subframe
MDT Minimization of Drive Tests
MIB Master Information Block
MME Mobility Management Entity
MSC Mobile Switching Center
NPDCCH Narrowband Physical Downlink Control Channel
NR New Radio
OCNG OFDMA Channel Noise Generator
OFDM Orthogonal Frequency Division Multiplexing
OFDMA Orthogonal Frequency Division Multiple Access
OSS Operations Support System
OTDOA Observed Time Difference of Arrival
O&M Operation and Maintenance
PBCH Physical Broadcast Channel
P-CCPCH Primary Common Control Physical Channel
PCell Primary Cell
PCFICH Physical Control Format Indicator Channel
PDCCH Physical Downlink Control Channel
PDP Profile Delay Profile
PDSCH Physical Downlink Shared Channel
PGW Packet Gateway PHICH Physical Hybrid-ARQ Indicator Channel
PLMN Public Land Mobile Network
PMI Precoder Matrix Indicator
PRACH Physical Random Access Channel
PRS Positioning Reference Signal
PSS Primary Synchronization Signal
PUCCH Physical Uplink Control Channel
PUSCH Physical Uplink Shared Channel
RACH Random Access Channel
QAM Quadrature Amplitude Modulation
RAN Radio Access Network
RAT Radio Access Technology
RLM Radio Link Management
RNC Radio Network Controller
RNTI Radio Network Temporary Identifier
RRC Radio Resource Control
RRM Radio Resource Management
RS Reference Signal
RSCP Received Signal Code Power
RSRP Reference Symbol Received Power OR Reference Signal Received Power
RSRQ Reference Signal Received Quality OR Reference Symbol Received Quality
RSSI Received Signal Strength Indicator
RSTD Reference Signal Time Difference
SC Successive Cancellation
SCH Synchronization Channel
SCL Successive Cancellation List
SCell Secondary Cell
SDU Service Data Unit
SFN System Frame Number
SGW Serving Gateway
SI System Information
SIB System Information Block
SNR Signal to Noise Ratio
SON Self Optimized Network
SS Synchronization Signal
SSB Synchronization Signal Block
SSS Secondary Synchronization Signal
TDD Time Division Duplex
TDOA Time Difference of Arrival
TOA Time of Arrival
TSS Tertiary Synchronization Signal
TTI Transmission Time Interval
UE User Equipment
UL Uplink
UMTS Universal Mobile Telecommunication System
USIM Universal Subscriber Identity Module
UTDOA Uplink Time Difference of Arrival
UTRA Universal Terrestrial Radio Access
UTRAN Universal Terrestrial Radio Access Network
WCDMA Wide CDMA
WLAN Wide Local Area Network

The invention claimed is:

1. A method performed by a wireless transmitter for polar encoding payload bits, the method comprising:
    identifying non-frozen payload bits of a data channel that have values that are known to a wireless receiver prior to transmission of the non-frozen payload bits
    placing a first subset of the known non-frozen payload bits at input positions of a polar encoder that correspond to the earliest decoding bit positions of the polar encoder;
    placing a second subset of the known non-frozen payload bits at input positions of the polar encoder that correspond to the least reliable decoding bit positions of the polar encoder after placement of the first subset of the known non-frozen payload bits;
    polar encoding the non-frozen payload bits; and
    transmitting the polar encoded non-frozen payload bits to the wireless receiver.

2. The method of claim 1, wherein the first subset of the known non-frozen payload bits are placed in earliest decoding bit positions to improve early termination gain.

3. The method of claim 1, wherein the second subset of the known non-frozen payload bits are placed in least reliable decoding bit positions to enhance error performance.

4. The method of claim 1, wherein the identified non-frozen payload bits that have known values include a half frame indication (HFI) bit, one or more synchronization signal (SS) block time index bits, and system frame number (SFN) bits.

5. The method of claim 1, wherein the first subset of the known non-frozen payload bits includes a half frame indication (HFI) bit and one or more synchronization signal (SS) block time index bits, and the second subset of the known non-frozen payload bits includes system frame number (SFN) bits.

6. The method of claim 5, wherein the SS block time index bits comprise the three most significant SS block time index bits.

7. The method of claim 5, wherein the second and third least significant bits of the SFN bits are polar decoded with less reliability than the remaining SFN bits.

8. The method of claim 1, wherein placing the first and second subset of known non-frozen payload bits comprises placing the bits using a bit interleaver or a bit mapper.

9. The method of claim 1, wherein the non-frozen payload bits that have known values include one or more reserved bits.

10. The method of claim 1, wherein the wireless transmitter comprises a network node.

11. A method performed by a wireless receiver for polar decoding payload bits, the method comprising:
    receiving a wireless signal corresponding to a data channel that includes non-frozen payload bits that have values that are known to the wireless receiver prior to reception of the non-frozen payload bits;
    polar decoding the wireless signal; and
    wherein the known non-frozen payload bits include a first subset of the known non-frozen payload bits that are polar decoded earliest of the payload bits in the data channel and a second subset of the known non-frozen payload bits that are polar decoded with least reliability of the non-frozen payload bits in the data channel after polar decoding of the first subset of known non-frozen payload bits.

12. The method of claim 11, wherein the first subset of the known non-frozen payload bits are in bit positions that are decoded earliest to improve early termination gain.

13. The method of claim 11, wherein the second subset of the known non-frozen payload bits are in the least reliable bit positions of the polar encoder after placement of the first subset to enhance error performance.

14. The method of claim 11, wherein the non-frozen payload bits that have known values include a half frame indication (HFI) bit, one or more synchronization signal (SS) block time index bits, and system frame number (SFN) bits.

15. The method of claim 11, wherein the first subset of the known non-frozen payload bits includes a half frame indication (HFI) bit and one or more synchronization signal (SS)

block time index bits, and the second subset of the known payload bits includes system frame number (SFN) bits.

16. The method of claim 15, wherein the one or more SS block time index bits comprise the three most significant SS block time index bits.

17. The method of claim 15, wherein the second and third least significant bits of the SFN bits are polar decoded with less reliability than the remaining SFN bits.

18. The method of claim 11, wherein the non-frozen payload bits that have known values include one or more reserved bits.

19. The method of claim 11, wherein the wireless receiver comprises a wireless device.

20. A wireless receiver configured to polar decode payload bits, the wireless receiver comprising processing circuitry operable to:
    receive a wireless signal corresponding to a data channel that includes non-frozen payload bits that have values that are known to the wireless receiver prior to reception of the non-frozen payload bits;
    polar decode the wireless signal; and
    wherein the known non-frozen payload bits include a first subset of the known non-frozen payload bits that are polar decoded earliest of the payload bits in the data channel and a second subset of the known non-frozen payload bits that are polar decoded with least reliability of the payload bits in the data channel after polar decoding of the first subset of known non-frozen payload bits.

* * * * *